US 6,277,762 B1

(12) United States Patent
Hwang

(10) Patent No.: US 6,277,762 B1
(45) Date of Patent: *Aug. 21, 2001

(54) METHOD FOR REMOVING REDEPOSITED VEILS FROM ETCHED PLATINUM

(75) Inventor: Jeng H. Hwang, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/524,771

(22) Filed: Mar. 14, 2000

Related U.S. Application Data

(63) Continuation of application No. 09/371,593, filed on Aug. 10, 1999, now Pat. No. 6,037,264, which is a continuation of application No. 09/201,589, filed on Nov. 30, 1998, now abandoned, which is a continuation of application No. 08/816,851, filed on Mar. 13, 1997, now abandoned.

(51) Int. Cl.⁷ .................................................... H01L 21/00
(52) U.S. Cl. ......................... 438/714; 438/720; 438/734
(58) Field of Search ............................... 438/714, 706, 438/710, 711–713, 720, 734

(56) References Cited

U.S. PATENT DOCUMENTS

| 4,889,588 | 12/1989 | Fior ...................................... 438/713 |
| 4,902,377 | 2/1990 | Berglund et al. ..................... 438/640 |
| 5,188,704 | 2/1993 | Babie et al. ............................ 216/79 |
| 5,232,747 | * 8/1993 | Evans, Jr. .............................. 427/539 |
| 5,258,093 | 11/1993 | Maniar ................................. 156/626 |

(List continued on next page.)

FOREIGN PATENT DOCUMENTS

| 0725430A2 | 7/1996 | (EP) . |
| 0786805A2 | 7/1997 | (EP) . |
| 0786805A3 | 7/1997 | (EP) . |
| 0795896 | 9/1997 | (EP) . |
| 0754430A3 | 5/1998 | (EP) . |

(List continued on next page.)

OTHER PUBLICATIONS

Tegal News Release (Prompt database No. 96:610238 Oct. 8, 1996.
an article entitled "Platinum Metal Etching in a Microwave Oxygen Plasma," J. App. Phys. 68(5), Sep. 1, 1990, pp. 2415–2423, by Chou et al.
an article entitled "Platinum Etching and Plasma Characteristics in RF Magnetron and Electron Cyclotron Resonance Plasmas," Jpn. J. Appl. Phys., vol. 32, (1993), pp 6102–6108, by Nishikawa et al.
an article entitled "High–Temperature Etching of PZT/Pt/TiN Structure by High–Density ECR Plasma," Jpn. J. Appl. Phys., vol. 34, (1995), pp. 767–770, by Yokoyama et al.

(List continued on next page.)

Primary Examiner—Benjamin L. Utech
Assistant Examiner—Kin-chan Chen
(74) Attorney, Agent, or Firm—Shirley L. Church

(57) ABSTRACT

A method of etching a platinum electrode layer disposed on a substrate. The method comprises providing a substrate supporting a platinum electrode layer, an insulation layer on the platinum electrode layer, and a resist layer on the insulation layer. A portion of the insulation layer is etched by employing a plasma of an etchant gas to break through and to remove the portion of the insulation layer from the platinum electrode layer to expose part of the platinum electrode layer. The exposed part of the platinum electrode layer is then etched by employing a plasma of an etchant gas comprising argon. The etched platinum electrode layer is subsequently overetched by employing a high density plasma of an etchant gas to remove redeposited veils from the etched platinum electrode layer. The etched platinum electrode layer is employed in a semiconductor device.

83 Claims, 17 Drawing Sheets

U.S. PATENT DOCUMENTS

| | | | |
|---|---|---|---|
| 5,492,855 | 2/1996 | Matsumoto et al. | 437/60 |
| 5,498,768 | 3/1996 | Nishitani et al. | 437/192 |
| 5,515,984 | 5/1996 | Yokoyama et al. | 216/41 |
| 5,527,729 | 6/1996 | Matsumoto et al. | 437/60 |
| 5,554,866 * | 9/1996 | Nishioka et al. | 257/295 |
| 5,565,036 | 10/1996 | Westendorp et al. | 118/723 |
| 5,658,820 | 8/1997 | Chung | 438/3 |
| 5,679,213 | 10/1997 | Noshiro | 156/643 |
| 5,686,339 | 11/1997 | Lee et al. | 437/60 |
| 5,696,018 | 12/1997 | Summerfelt et al. | 437/60 |
| 5,707,487 | 1/1998 | Hori et al. | 156/659.11 |
| 5,753,044 | 5/1998 | Hanawa et al. | 118/723 |
| 5,792,593 * | 8/1998 | McClure et al. | 430/314 |
| 5,854,104 | 12/1998 | Onishi et al. | 438/240 |
| 6,037,264 * | 3/2000 | Hwang | 438/714 |

FOREIGN PATENT DOCUMENTS

| | | |
|---|---|---|
| 0858103A2 | 5/1998 | (EP). |
| 98 30 1614 | 8/1999 | (EP). |
| 59-016334 | 1/1984 | (JP). |
| 11111695 | 4/1999 | (JP). |
| 98/00859 | 1/1998 | (WO). |

OTHER PUBLICATIONS an article entitled "Control of Etch Slope During Etching of Pt in Ar/$Cl_2$/$O_2$ Plasmas," Jpn. J. Appl. Phys., vol. 35 (1996), pp. 2501–2504 by Yoo et al.

an article entitled "High–K Dielectric Materials for DRAM Capacitors," Semiconductor International, Nov. 1996, pp. 109–116, by Kotecki.

a paper entitled "New Insight into the Reactive Ion Etching of Fence–Free Patterned Platinum Structures" at the 43$^{rd}$ Symposium of AVS, Oct. 1996, Philadelphia, PA, by Milkove et al.

an article entitled "The Etching of Platinum Electrodes for PZT Based Ferroelectric Devices," Electrochemical Society Proceedings, vol. 96–12 (1996), pp. 515–520, by Keil et al.

an article entitled "Patterning of Pt thin films using SiO/sub 2/ mask in a high density plasma," Journal of the Korean Institute of Telematics and Electronics, Mar. 1997, by Lee et al.

an article entitled "The study on the etching mechanism of Pt thin film by inductive coupled plasma," Journal of the Korean Institute of Telematics and Electronics, Jun. 1997, by Kwang–Ho Kwon et al.

an article entitled "High Temperature Etching of PZT/PT/TiN Structure by High Density ECR Plasma," International Conference on Solid State Devices and Materials, Aug. 1994, by Yokoyama et al.

an article entitled "Process Integration of the Stacked Ferroelectric Capacitor Cell," Proceedings of the Symposium on Semiconductors and Integrated Circuits Technology, 1997 Vo. 52p. 159.164, date:1/92, by Kazuya et al.

an article entitled "Reactive ion etch study for producing patterned platinum structures," Proceedings of the 1996 8$^{th}$ International Symposium on Integrated Ferroelectrics 16 (1–4) pt. 3 1997, pp 109–138, by Farrell et al.

an article entitled "Etching of platinum and high dielectric constant films" Oyo Butsuri, 1994 vo. 63, No. 11, 1139–1142, by Teruo et al.

Tegal News Release, Business Wire published Jul. 10, 1996.

an article entitled "Study on Fence–Free Platinum Etching Using Chlorine–Based Gases in Inductively Coupled Plasma," *J. Electrochem. Soc.,* 144(11):L294–L296 (1997) by Chung, C.W. et al.

an article entitled "Plasma Etch of Ferroelectric Capacitors in FeRAMs and DRAMs," *Semiconductor International,* pp. 102–108 (Sep. 1997) by DeOrnellas, S. et al.

* cited by examiner

METHOD FOR REMOVING REDEPOSITED VEILS FROM ETCHED PLATINUM

This is a continuation patent application of patent application Ser. No. 09/371,593, filed Aug. 10, 1999, now U.S. Pat. No. 6,037,264 which is a continuation of patent application Ser. No. 09/201,589, filed Nov. 30, 1998, abandoned patent application Ser. No. 09/201,589 is a continuation patent application of patent application Ser. No. 08/816,851, filed Mar. 13, 1997, now abandoned.

BACKGROUND OF THE INVENTION

1. Field of the Invention

This invention relates to plasma etching of platinum. More specifically, this invention provides a method for plasma etching of platinum and for the subsequent removal of redeposited veils formed during the plasma etching of platinum. The plasma etching is conducted for producing semiconductor integrated circuits containing platinum electrodes.

2. Description of the Prior Art

The implemetation of digital information storage and retrieval is a common application of modern digital electronics. Memory size and access time serve as a measure of progress in computer technology. Quite often storage capacitors are employed as memory array elements. As the state of the art has advanced, small-feature-size high density dynamic random access memory (DRAM) devices require storage capacitors of larger capacitance and high dielectric constant materials. The high dielectric constant materials or ferroelectric materials are made primarily of sintered metal oxide and contain a substantial amount of very reactive oxygen. In the formation of capacitors with such ferroelectric materials or films, the electrodes must be composed of materials with least reactivity to prevent oxidation of the electrodes which would decrease the capacitance of storage capacitors. Therefore, precious metals, such as platinum (Pt), palladium (Pd), etc., are preferred metals used in the manufacture of capacitors for high density DRAM.

Among the possible precious metals for capacitor electrodes, platinum has emerged as an attractive candidate because it is inert to oxidation and is known to have a leakage current ($<10^{-9}$ amps/cm$^2$) lower than other electrodes such as $RuO_2$ and poly-Si. Platinum also has a high conductivity.

In the prior art, platinum etching has been conducted by means of isotropic etching, such as wet etching with aqua regia, or by anisotropic etching, such as ion milling with Ar gas or by other means. Because of the nature of isotropic etching, using wet etching with aqua regia causes deteriorated processing accuracy. The grade of precision in isotropic etching is not high enough for fine pattern processing. Therefore, it is difficult to perform submicron patterning of platinum electrodes due to its isotropic property. Furthermore, a problem with ion milling (i.e. anisotropic etching) occurs because the etching speed on platinum, which is to form the electrode, is too slow for mass production.

In order to increase processing accuracy in etching platinum, research and development has been quite active, particularly in the area of etching platinum by means of a dry etching process where etchant gases (e.g., $Cl_2$, HBr, $O_2$, etc.) are used. The following prior art is representative of the state of art with respect to etching platinum with a plasma of etching gases.

U.S. Pat. No. 5,492,855 to Matsumoto et al discloses a semiconductor device manufacturing method, wherein an insulation layer, a bottom electrode Pt layer, a dielectric film and a top electrode Pt layer are provided on electrode Pt layer, a dielectric film and a top electrode Pt layer are provided on top of a substrate having already-completed circuit elements and wiring, and then, a capacitor is formed by selectively dry etching the bottom electrode Pt layer after selectively dry etching the top electrode Pt layer and the dielectric film. The manufacturing method uses a gas containing an S component as etching gas for Pt etching, or an etching gas containing S component as an additive gas; and also it implants S into the Pt layer before the Pt dry etching process by means of ion implantation to compose a S and Pt compound, and then dry etches the Pt compound thus composed.

U.S. Pat. No. 5,527,729 to Matsumoto et al discloses process steps to form on a substrate in which circuit elements and wirings, etc., are already shaped, an insulation layer, a first metal layer, a dielectric film and a second metal layer. A top electrode and a capacitance film are formed by dry etching the second metal layer and the dielectric film. A bottom electrode is formed by dry etching the first metal layer. The etching gas for dry etching the second metal layer is a mixed gas containing hydrogen hialide (e.g. HBr) and oxygen, having a ratio of oxygen against the total of hydrogen halide and oxygen set at about 10%–35%. The etching gas is also taught as a gas containing hydrocarbon, such as chloroform. Matsumoto et al employs a silicon oxide layer as the insulation layer on the substrate, and a platinum layer or palladium layer as the first and second metal layers. Dry etching of the second metal layer and dielectric film is conducted in a low pressure region not higher than about 5 Pa, where the etching speed is high. Matsumoto et al further teaches that where a mixed gas of hydrogen halide and oxygen is used as the etching gas, the etching speed on the silicon oxide layer can be made sufficiently low relative to that on the second metal layer made of a platinum layer or a palladium layer; in this way, the excessive etching of the silicon oxide layer underlying the first metal layer is avoided, and damage to the circuit elements and wiring, etc. underneath the silicon oxide layer can be prevented. Furthermore according to Matsumoto et al, the ratio of etching speed of the platinum and dielectric material to the resist can be increased by lowering the etching speed on the resist. Therefore, etching of the platinum and dielectric material may be conducted by using a mask of normal lay-thickness resist (generally speaking, about 1.2 $\mu$m to about 2.0 $\mu$m thick), instead of using a conventional thick-layer resist (about 3 $\mu$m and thicker).

Chou et al in an article entitled "Platinum Metal Etching in a Microwave Oxygen Plasma", J. Appl. Phys. 68 (5), Sep. 1, 1990, pages 2415–2423, discloses a study to understand the etching of metals in both plasma and chemical systems. The study found that the etching of platinum foils in an oxygen plasma generated in a flow-type microwave system and that very rapid etching (~6 Å/s) took place even at low power inputs (200 W). The principal plasma parameters, including oxygen atom concentration, ion concentration, and electron temperature, were measured by Chou et al as a function of distance below the microwave coupler. These were correlated to the rate of foil etching, which decreased with increasing distance from the coupler. On the basis of these correlations Chou et al formulated a simple mechanistic model. The study by Chou et al further found that the etching of platinum in an oxygen plasma jet results from the concomitant action of oxygen atoms and high energy electrons.

Nishikawa et al in an article entitled "Platinum Etching and Plasma Characteristics in RF Magnetron and Electron Cyclotron Resonance Plasmas", Jpn. J. Appl. Phys., Vol. 34 (1995), pages 767–770, discloses a study wherein the properties of platinum etching were investigated using both rf magnetron and electron cyclotron resonance (ECR) plasmas, together with measurement of the plasma parameters (neutral concentration, plasma density, etc.). Nishikawa et al performed experiments in $Cl_2$ plasmas over a pressure ranging from 0.4 to 50 mTorr. In rf magnetron plasmas, the etch rate of Pt was constant at the substrate temperature of from 20 to 160° C. The etch rate and the plasma electron density increased with gas pressure decreasing from 50 to 5 mTorr. In ECR plasmas for rf power of 300 W, Nishikawa et al found that the etch rate of Pt was almost constant (~100 nm/min) with gas pressure decreasing from 5 to 0.4 mTorr, while the plasma electron density gradually increased with decreasing gas pressure. The study by Nishikawa et al discusses these experimental results with respect to the relationship between the etch yield and the ratio of neutral $Cl_2$ flux and ion flux incident on the substrate.

Yokoyama et al in an article entitled "High-Temperature Etching of PZT/Pt/TiN Structure by High-Density ECR Plasma", Jpn. J. Appl. Phys., Vol. 34 (1995), pages 767–770, discloses a study wherein submicron patterning technologies for the PZT/Pt/TiN/Ti structure with a-spin on glass (SOG) mask are demonstrated using a high-density electron cyclotron resonance (ECR) plasma and a high substrate temperature above 300° C. A 30%-$Cl_2$/Ar gas was used to etch a lead zirconate titanate (PZT) film. No deposits remained, which resulted in an etched profile of more than 80°. A 40%-$O_2$/$Cl_2$ gas was used to etch a Pt film. The etching was completely stopped at the Ti layer. 30-nm-thick deposits remained on the sidewall. They were removed by Yokoyama et al after dipping in hydrochloric acid. The etched profile of a Pt film was more than 80°. The Ti/TiN/Ti layer was etched with pure $Cl_2$ gas. The size shift from the SOG mask was less than 0.1 $\mu$m. Yokoyama et al did not detect any interdiffusion between SOG and PZT by transmission electron microscopy and energy dispersive x-ray spectroscopy (TEM-EDX) analysis.

Yoo et al in an article entitled "Control of Etch Slope During Etching of Pt in Ar/$Cl_2$/$O_2$ Plasmas", Jpn. J. Appl. Phys., Vol. 35 (1996), pages 2501–2504, teaches etching of Pt patterns of the 0.25 $\mu$m design rule at 20° C. using a magnetically enhanced reactive ion etcher (MERIE). Yoo et al found that a major problem of etching with a MERIE was the redeposition of the etch products onto the pattern sidewall, making it difficult to reduce the pattern size. In both cases separately using a photoresist mask and an oxide mask, the redeposits of the etch products onto the sidewall were reduced by the addition of $Cl_2$ to Ar, although the etched slope was lowered to 45°. The redeposits were removed by an HCl cleaning process.

Kotecki in an article entitled "High-K Dielectric Materials for DRAM Capacitors", Semiconductor International, November 1996, pages 109–116, the potential advantages of incorporating high-dielectric materials into a storage capacitor of a dynamic random access memory (DRAM) are described and the requirements of the high dielectric layer are reviewed as they relate to use in a simple stack capacitor structure suitable for the gigabit generation. Kotecki teaches that when considering the use of high-dielectric materials in a stack capacitor structure, the following issues need to be addressed: electrode patterning, high-dielectric material/barrier interaction, electrode/high-dielectric material interaction, surface roughness (e.g. hilocking, etc.), step coverage, high-dielectric material uniformity (e.g. thickness, composition, grain size/orientation, etc.), and barrier (e.g. $O_2$ and Si diffusion, conductivity, contact resistance and interactions, etc.). Various materials and combinations of materials were studied by Kotecki for use with perovskite dielectrics including the noble metals (i.e. Pt, Ir, Pd) and conductive metal oxides (i.e. $IrO_2$ and $RuO_2$). The work function of these materials, their ability to be patterned by dry etching, the stability of the surface with regards to surface roughening and their suitability in a semiconductor fabricator are listed by Kotecki in the following Table I:

TABLE I

Comparison of the Properties of Various Electrode Materials Suitable for Use with Perovskite Dielectrics

| Material Selection | Work Function | Dry Etch | Surface Stability | Deposition Method |
|---|---|---|---|---|
| Pt | 5.6–5.7 | difficult | potential problem | sputtering |
| Ru | 4.7 | easy/dangerous | potential problem | sputtering |
| $RuO_2$/Ru | | easy/dangerous | good | reactive sputtering |
| Ir | 5.0–5.8 | difficult | good | sputtering |
| $IrO_2$/Ir | | difficult | good | reactive sputtering |
| Pd | 5.1–5.6 | difficult | ? | sputtering |

Kotecki further teaches in the article entitled "High-K Dielectric Materials for DRAM Capacitors" that one of the major problems which needs to be overcome with respect to the manufacturing of DRAM chips using capacitors is the problem of electrode patterning. There are minimal volatile species produced during the dry etching of the noble metal electrodes such as Pt, Ru, Pd and Ir. Since the etch mechanism is primarily by physical sputtering, even during a RIE process, fences are typically formed on the sides of the photoresist. To eliminate the problem of fencing, it is possible to etch the fence layer and erode the sides of the photoresist during the etch process which leads to "clean" metal structures but with sloping sidewall angles and a loss of control over critical feature sizes. As the dimension of the feature shrinks to 0.18 $\mu$m or below, only limited tapering of the sidewall angle can be tolerated. Kotecki presents in the following Table II some of the high-dielectric materials which have been considered for use in a DRAM capacitor, the various methods which can be used to form the films, and the range of reported permittivites:

TABLE II

A Comparison of Various High-Dielectric and Method for Formation and Dielectric Constants

| Material | Deposition Methods | $\epsilon_r$(thin films) |
|---|---|---|
| $SrTiO_3$ | MOCVD, ECR-CVD, sol-gel, sputtering, PLD | 90–240 |
| (Ba, Sr)$TiO_3$ | MOCVD, ECR-CVD, sol-gel, sputtering, PLD | 160–600 |
| PLT | MOCVD, sol-gel, sputtering, pld | 400–900 |
| PZT and PLZT | MOCVD, sol-gel, sputtering, PLD | >1000 |

Milkove et al reported in a paper entitled "New Insight into the Reactive Ion Etching of Fence-Free Patterned Platinum Structures" at the 43rd Symposium of AVS, October 1996, Philadelphia, Pa., that an investigation was undertaken to characterize the time progression of the Pt etch process during the reactive ion etching (RIE) of fence-free patterned structures. The experiment by Milkove et al consisted of coprocessing two oxidized Si wafers possessing identical 2500 Å thick Pt film layers, but different photoresist (PR) mask thicknesses. Etching was suspended at 20, 40, 60 and 80% of the full etch process in order to cleave off small pieces of wafer for analysis by a scanning electron microscopy (SEM). Using $Cl_2$-based RIE conditions known to produce fence-free etching for 2500 Å thick film layers, Milkove et al discovered that a severe fence actually coats the PR mask during the first 20% of the etch process. As the etch continues the fence structure evolves, achieving a maximum height and width followed by progressive recession until disappearing completely prior to process endpoint. The data from Milkove et al shows that the final profile of an etched Pt structure possess a functional dependence on the initial thickness and slope of the PR mask, as well as on the initial thickness of the Pt layer. Milkove et al further reported in the paper entitled "New Insight Into The Reactive Ion Etching of Fence-free Patterned Platinum Structures" that the observed behavior of the transient fence provides the strongest evidence to date supporting the existence of a chemically assisted physical sputtering component associated with the RIE of Pt films in halogen-based plasmas.

Keil et al teaches in an article entitled "The Etching of Platinum Electrodes for PZT Based Ferroelectric Devices", Electrochemical Society Proceedings, Vol. 96–12 (1996), pages 515–520, that the technical difficulties of fabricating capacitors employing platinum Pt etching is most often dominated by sputtering processes. While oxygen and/or various gaseous chlorides or fluorides are used to chemically enhance the etch process, the products of both etch mechanisms are usually of low volatility and tend to redeposit on the wafer. After etching, large wall-like structures extend up from the edges of the Pt region. These wall-like structures are frequently referred to as "veils" or "fences" or "rabbit ears" and can reach lengths which are more than double the thickness of the Pt film to which they are attached. The existence of such structures makes useful deposition of the PZT layer impossible. Keil et al further teaches that even when one is able to attenuate redeposition to the point where only small "nub" like features are present; the high electric fields which will form at such "nubs" enhances the likelihood for dielectric breakdown. Although process conditions can be found which result in either low redeposition or even no redeposition, they most often also give an unacceptably tapered platinum profile angle. Keil et al observed that redeposition becomes more severe as process conditions are pushed toward those which give increasingly vertical sidewalls. While a post etch wet clean in a solvent bath is frequently used, the heavy redeposition which attends the pursuit of vertical sidewalls regularly renders this approach minimally effective.

The forgoing prior art illustrates that generally a clean vertical dense area profile and CD (critical dimension) control of the etch profiles are critical factors for successful plasma etching of 1-Gbit (and beyond) DRAM ferroelectric devices possessing platinum electrodes. Redeposition and profile control are found to be strongly interlinked. Optimization of both profile angle and redeposition requires a tradeoff between the two. Where as vigorous post etch cleaning (e.g. wet cleaning with acid, mechanical polishing, etc.) can relieve some of the need to achieve a deposition free plasma etch, such post etch cleaning does not possess the accuracy that is desired as the platinum electrode itself is typically eroded and/or deteriorated by currently known post etch cleaning methods. Therefore, what is needed and what has been invented is a method for more accurately removing platinum veils from a platinum electrode formed during etching of the platinum electrode the methods of the present invention may be employed for producing a capacitance structure, more specifically for manufacturing a semiconductor device.

SUMMARY OF THE INVENTION

The present invention accomplishes its desired objects by broadly providing a method for removing redeposited veils from a platinum electrode formed during etching of the platinum electrode comprising the steps of:

a) providing a platinum electrode having redeposited veils formed on the platinum electrode during etching of the platinum electrode;

b) etching the platinum electrode of step (a) including employing a high density plasma of an etchant gas to remove the redeposited veils from the platinum electrode.

The high density plasma of an etchant gas is a plasma of an etchant gas having an ion density greater than about $10^9/cm^3$, preferably greater than about $10^{11}/cm^3$. The etchant may be selected from the group consisting of chlorine, oxygen, argon and mixtures thereof. The platinum electrode of step (a) above may additionally comprise a mask layer disposed on a selected part of the platinum electrode to selectively protect the platinum electrode during the etching step (b) above. The platinum electrode of step (a) may also additionally comprise a protective layer disposed on the selected part of the platinum electrode between the mask layer and the platinum electrode. The mask layer may be removed during or after the etching step (b). Similarly, the protective layer may be removed during or after the etching step (b). The redeposited veils of step (a) above were previously formed on the platinum electrode during etching of the platinum electrode employing a plasma of an etchant gas preferably comprising argon. The platinum electrode is part of or is contained in a platinum electrode wafer, and the method for removing the redeposited veils from the platinum electrode additionally comprises disposing the platinum electrode wafer including the platinum electrode of step (a) in a high density plasma chamber having a coil inductor and a wafer pedestal; and performing the etching step (b) in the high density plasma chamber under the following process conditions:

| Process | Parameters |
| --- | --- |
| Etchant Gas Flow | 50 to 400 sccm |
| Pressure, mTorr | 0.5 to 40 milliTorr |
| RF Power (watts) of Coil Inductor | 100 to 3000 watts |
| RF Power (watts) of Wafer Pedestal | 50 to 1500 watts |
| Temperature (° C.) of Platinum Electrode Wafer | 20 to 500° C. |
| Veil Etch Rate (Å/min) | 200 to 2000 Å/min |
| RF Frequency of Coil Inductor | 100K to 200 MHz |
| RF Frequency of Wafer Pedestal | 100K to 200 MHz |

The platinum electrode in the providing step (a) above additionally includes a redeposited sidewall; and the process conditions additionally comprise a sidewall etch rate ranging from about 0 Å/min to about 300 Å/min. The etchant gas for the process conditions immediately above includes up to about 100% by volume oxygen, preferably from about 50 to about 100% by volume oxygen, more preferably from about 0 to about 50% by volume chlorine and from about 50 to about 100% by volume oxygen.

The present invention also accomplishes its desired objects by broadly providing a method for producing a capacitance structure including a platinum electrode comprising the steps of:
 a) providing a substrate supporting a platinum electrode layer and at least one mask layer disposed on a selected part of the platinum electrode layer;
 b) etching the platinum electrode layer of step (a) including employing a plasma of an etchant gas comprising argon to produce the substrate supporting an etched platinum electrode layer with the at least one mask layer disposed on a selected part of the etched platinum electrode layer; and
 c) overetching the etched platinum electrode layer of step (b) including employing a high density plasma of an etchant gas to produce a capacitance structure.

The at least one mask layer is removed during or after the overetching step (c) immediately above. The platinum electrode layer of step (a) immediately above may additionally comprise a protective layer disposed on the selected part of platinum electrode layer between the mask layer and the platinum electrode layer. The etched platinum electrode layer produced by the etching step (b) immediately above includes at least one redeposited veil formed thereon; and the overetching step (c) removes the at least one redeposited veil from the etched platinum electrode layer. The etchant gas of the high density plasma of step (c) is selected from the group consisting of chlorine; oxygen and mixtures thereof. The platinum electrode is part of or is contained in a platinum electrode wafer, and the method for producing a capacitance structure including a platinum electrode layer additionally comprises disposing, prior to the overetching step (c), the platinum electrode wafer including the etched platinum electrode layer of step (b) in a high density plasma chamber having a coil inductor and a wafer pedestal; and performing the overetching step (c) in the high density plasma chamber under the following previously indicated process conditions:

| Process | Parameters |
|---|---|
| Etchant Gas Flow | 50 to 400 sccm |
| Pressure, mTorr | 0.5 to 40 milliTorr |
| RF Power (watts) of Coil Inductor | 100 to 3000 watts |
| RF Power (watts) of Wafer Pedestal | 50 to 1500 watts |
| Temperature (° C.) of Platinum Electrode Wafer | 20 to 500° C. |
| Veil Etch Rate (Å/min) | 200 to 2000 Å/min |
| RF Frequency of Coil Inductor | 100K to 200 MHz |
| RF Frequency of Wafer Pedestal | 100K to 200 MHz |

As previously indicated, the platinum electrode layer additionally includes a redeposited sidewall; and the process conditions additionally comprise a sidewall etch rate ranging from about 0 Å/min to about 300 Å/min. As further previously indicated, the etchant gas for the process conditions immediately above includes up to about 100% by volume oxygen, preferably from about 50 to about 100% by volume oxygen, more preferably from about 0 to about 50% by volume chlorine and from about 50 to about 100% by volume oxygen.

The present invention further accomplishes its desired objects by broadly providing a method of manufacturing a semiconductor device comprising the steps of:
 a) forming a resist layer, an insulation layer and a platinum electrode layer on a substrate having circuit elements formed thereon;
 b) etching a portion of the insulation layer including employing a plasma of an etchant gas to break through and to remove the portion of the insulation layer from the platinum electrode layer to produce the substrate supporting the resist layer, a residual insulation layer, and the platinum electrode layer;
 c) removing the resist layer of step (b) to produce the substrate supporting the residual insulation layer and the platinum electrode layer;
 d) etching the platinum electrode layer of step (c) including employing a plasma of an etchant gas comprising argon to produce the substrate supporting the residual insulation layer disposed on an etched platinum electrode layer having at least one redeposited veil formed thereon; and
 e) overetching the etched platinum electrode layer including employing a high density plasma of an etchant gas to remove the redeposited veil from the etched platinum electrode layer and produce a semiconductor device.

The present invention also further accomplishes its desired objects by broadly providing a method of etching a platinum electrode layer disposed on a substrate comprising the steps of:
 a) providing a substrate supporting a platinum electrode layer, an insulation layer on the platinum electrode layer, and a resist layer on the insulation layer;
 b) etching a portion of the insulation layer including employing a plasma of an etchant gas to break through and to remove the portion of the insulation layer from the platinum electrode layer to expose part of the platinum electrode layer and to produce the substrate supporting the platinum electrode layer, a residual insulation layer on the platinum electrode layer, and the resist layer on the residual insulation layer;
 c) etching the exposed part of the platinum electrode layer of step (b) including employing a plasma of an etchant gas comprising argon to produce the substrate supporting an etched platinum electrode layer having at least one redeposited veil formed thereon, and the residual insulation layer on the etched platinum electrode layer; and
 d) overetching the etched platinum electrode layer of step (c) including employing a high density plasma of an etchant gas to remove the redeposited veil from the etched platinum electrode layer.

The resist layer may be removed from the residual insulation layer before, during, or after etching of the platinum electrode layer. The residual insulation layer may be removed from the platinum electrode layer either during or after the overetching step. The platinum electrode layer is part of or is contained in a platinum electrode wafer and may be provided with a protective layer disposed between the platinum electrode layer and the insulation layer. The purpose of the protective layer is to maintain the platinum profile of the platinum electrode layer, especially during the overetching process of the present invention.

Overetching of the etched platinum electrode to remove redeposited veils is performed in a high density plasma chamber. The overetching step employs a high density plasma of an etchant gas selected from the group consisting of chlorine, oxygen, argon, and mixtures thereof. The high density plasma chamber possesses a separate control for ion flux and a separate control for ion energy. As previously indicated, the ion density of the high density plasma in the high density plasma chamber is greater than about $10^9/cm^3$.

The high density plasma chamber for the method of manufacturing a semiconductor device and for the method of etching a platinum electrode layer disposed on a substrate includes a coil inductor and a wafer pedestal; and the overetching step in both of the methods is performed in the high density plasma chamber under the following previously mentioned process conditions:

| Process | Parameters |
|---|---|
| Etchant Gas Flow | 50 to 400 sccm |
| Pressure, mTorr | 0.5 to 40 milliTorr |
| RF Power (watts) of Coil Inductor | 100 to 3000 watts |
| RF Power (watts) of Wafer Pedestal | 50 to 1500 watts |
| Temperature (° C.) of Platinum Electrode Wafer | 20 to 500° C. |
| Veil Etch Rate (Å/min) | 200 to 2000 Å/min |
| RF Frequency of Coil Inductor | 100K to 200 MHz |
| RF Frequency of Wafer Pedestal | 100K to 200 MHz |

As previously indicated, the platinum electrode layer additionally includes a redeposited sidewall, and the process conditions additionally comprise a sidewall etch rate ranging from about 0 Å/min to about 300 Å/min. As was further previously indicated, the etchant gas for the process conditions immediately above includes up to about 100% by volume oxygen, preferably from about 50 to about 100% by volume oxygen, more preferably from about 0 to about 50% by volume chlorine and from about 50 to about 100% by volume oxygen.

It is therefore an object of the present invention to provide a method for removing redeposited veils from a platinum electrode formed during etching of the platinum electrode.

It is another object of the present invention to provide a method of manufacturing a semiconductor device.

It is also another object of the present invention to provide a method of manufacturing a capacitance structure.

It is yet another object of the present invention to provide a method of etching a platinum electrode layer disposed on a substrate.

These, together with the various ancillary objects and features which will become apparent to those skilled in the art as the following description proceeds, are attained by these novel methods, a preferred embodiment thereof shown with reference to the accompanying drawings, by way of example only, wherein:

DESCRIPTION OF PREFERRED EMBODIMENTS OF THE INVENTION

Figure 1:
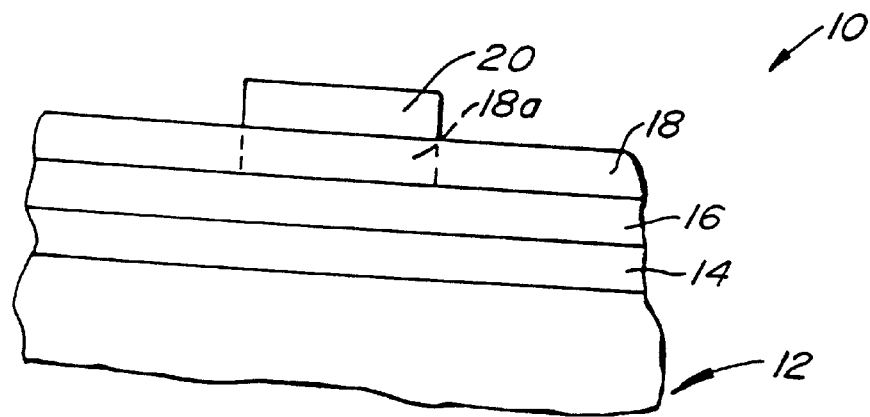
FIG. 1 is a side elevational view of a semiconductor wafer having a semiconductor substrate, a barrier layer disposed on the semiconductor substrate, a platinum electrode layer disposed on the barrier layer, an insulation layer disposed on the platinum electrode layer, and a resist disposed on the insulation layer.
Figure 2:
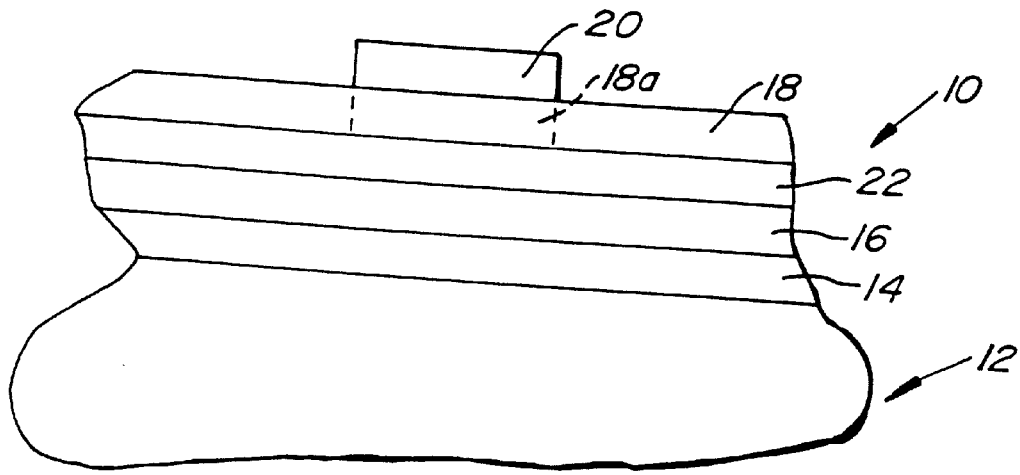
FIG. 2 is a side elevational view of the semiconductor wafer of FIG. 1 additionally including a protective layer disposed on the platinum electrode layer between the insulation layer and the platinum electrode layer.

Referring in detail now to the drawings wherein similar parts of the present invention are identified by like reference numerals, there is seen in FIG. 1 a wafer, generally illustrated as 10, having a semiconductor substrate, generally illustrated as 12. The semiconductor substrate 12 includes regions of circuit elements which do not appear in the drawings, but are well known to those skilled in the art. A barrier layer 14 is disposed over the semiconductor substrate 12 and a platinum electrode layer 16 is disposed over the barrier layer 14. Because the platinum electrode layer 16 easily diffuses or reacts with certain elements (e.g. a poly-Si plug) within the semiconductor substrate 12, the barrier layer 14 is required between the platinum electrode layer 16 and the semiconductor substrate 12. The barrier layer 14 also functions as an adhesive for coupling the semiconductor substrate 12 to the platinum electrode layer 16. An insulation layer or mask 18 is disposed over the platinum electrode layer 16 and a resist 20 (i.e. a photoresist or photomask) is selectively positioned on the insulation layer 18 as best shown in FIG. 1. In another preferred embodiment of the invention as shown in FIG. 2, a protective layer 22 is disposed between the platinum electrode layer 16 and the insulation layer 18.

The barrier layer 14 may be any suitable barrier layer which is capable of dually functioning as an adhesive and a diffusion barrier to the platinum electrode layer 16. The barrier layer 14 may be of any suitable thickness. Preferably, the barrier layer 14 comprises titanium and/or a titanium alloy, such as TiN, and possesses a thickness ranging from about 50 Angstroms to about 600 Angstroms, more preferably from about 200 Angstroms to about 400 Angstroms, most preferably about 300 Angstroms. The barrier layer 14 is preferably disposed on the semiconductor substrate 12 by the RF magnetron sputtering method.

The platinum electrode layer 16 is used as the electrode material because it is inert to oxidation which tends to occur in the subsequent high temperature processes of depositing the high dielectric constant ferroelectric materials. The platinum electrode layer 16 is also used as the electrode material because platinum is a good electric conductor. The thickness of the platinum electrode layer 16 would depend upon the end use of the semiconductor or capacitance device which is to contain the platinum electrode layer 16. Typically, the thickness of the platinum electrode layer 16 ranges from about 500 Angstroms to about 4000 Angstroms, more preferably from about 1000 Angstroms to about 3000 Angstroms, most preferably about 2000 Angstroms. The platinum electrode is preferably disposed on the barrier layer 14 by the RF magnetron sputtering method.

The insulation layer 18 may be any suitable insulation layer that is capable of being etched in accordance with the procedure described hereinafter such that all traces of the insulation layer 18 are essentially removed from the surface platinum electrode layer 16 except that portion (identified as "18a" below) of the insulation layer 18 remaining under the resist 20. The insulation layer 18 may also be of any suitable thickness. Preferably, the insulation layer 18 comprises silicon dioxide ($SiO_2$) and/or silicon nitride ($Si_3N_4$) or any other suitable dielectric material. A preferred thickness for the insulation layer 18 ranges from about 1000 Angstroms to about 5000 Angstroms, more preferably from about 2000 Angstroms to about 4000 Angstroms, most preferably about 3000 Angstroms. The insulation layer 18 is preferably disposed on the platinum electrode layer 16 by chemical vapor deposition.

The resist 20 (i.e. the photoresist 20) may be any suitable layer of material(s) that is capable of protecting any underlying material (e.g. the insulating layer 18) from being etched during the etching process of the present invention. Suitable materials for the resist 20 include resist systems consisting of novolac resin and a photoactive dissolution inhibitor (all based on Süss's discovery). Other suitable materials for the resist 20 are listed in an article from the July 1996 edition of Solid State Technology entitled "Deep-UV Resists: Evolution and Status" by Hiroshi Ito. The resist 20 may have any suitable thickness; preferably, the thickness of the resist 20 ranges from about 0.3 $\mu$m to about 1.40 $\mu$m, more preferably from about 0.4 $\mu$m to about 0.8 $\mu$m, most preferably about 0.6 $\mu$m. The resist 20 is preferably disposed on the insulation layer 18 by the spin coating method.

The protective layer 22 in the embodiment of the invention depicted in FIG. 2 is for protecting the corners (identified as "16c" below) of an etched platinum electrode layer (identified as "16a" below) during the overetching process of the present invention. The protective layer 22 may comprise any suitable materials or chemicals, such as titanium and/or titanium nitride etc., and may be conveniently disposed on the surface of the platinum electrode layer 16, such as by the RF magnetron sputtering method. The thickness of the protective layer 22 may be any suitable thickness, preferably ranging from about 50 Angstroms to about 1000 Angstroms, more preferably ranging from about 100 Angstroms to about 600 Angstroms, most preferably about 300 Angstroms.

Figure 5:
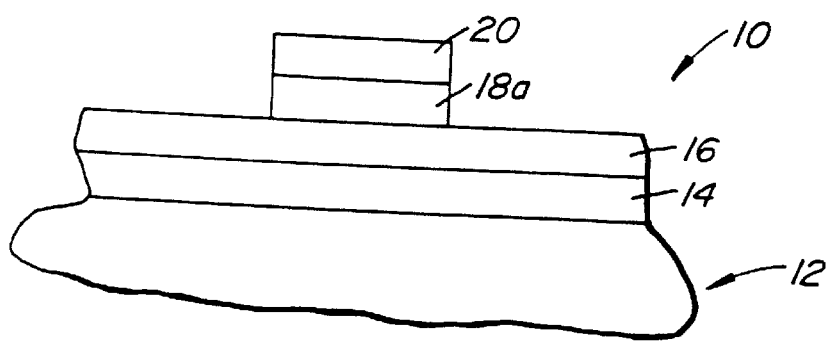
FIG. 5 is a side elevational view of the semiconductor wafer of FIG. 1 after etching and removing a portion of the insulation layer from the surface of the platinum electrode layer to expose the platinum electrode layer.
Figure 6:
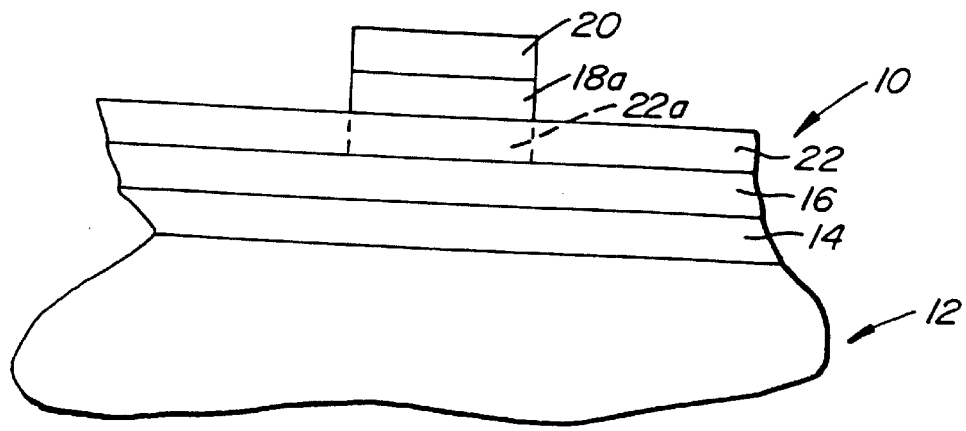
FIG. 6 is a side elevational view of the semiconductor wafer of FIG. 2 after etching and removing a portion of the insulation layer from the surface of the protective layer to expose the protective layer.

In order to form or produce a semiconductor or capacitance device from the multilayered structure of FIG. 1 or FIG. 2, the multilayered structure is initially placed in a suitable plasma processing apparatus to break through and remove or etch away from the surface of platinum electrode layer 16 the insulation layer 18, except that insulation layer 18a that is below the resist 20, as best shown in FIG. 5, or as best shown in FIG. 6 if the embodiment of the invention depicted in FIG. 2 is being employed.

Figure 3:
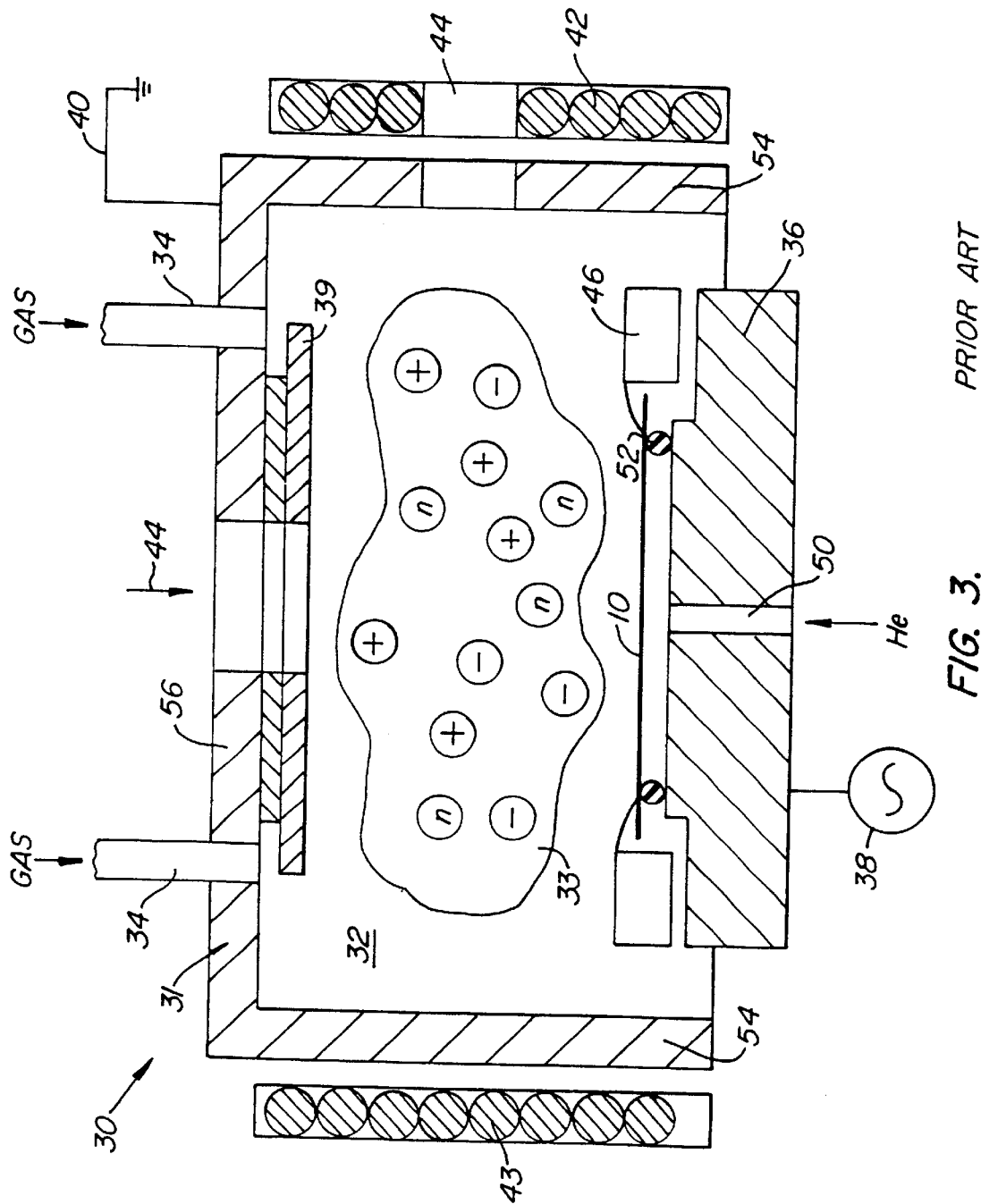
FIG. 3 is a vertical sectional view of a prior art plasma processing apparatus including a plasma etching reactor with an electromagnetic unit for enhancing a plasma.

A suitable prior art plasma processing apparatus is shown in FIG. 3 and described in U.S. Pat. No. 5,188,704 to Babie et al, fully incorporated herein by reference thereto as if repeated verbatim immediately hereinafter. The plasma process apparatus of FIG. 3 comprises a plasma reactor, generally illustrated as 30 and including walls, generally illustrated as 31 for forming and housing a reactor chamber 32 wherein a plasma 33 of neutral (n) particles, positive (+) particles, and negative (−) particles are found. Walls 31 include cylindrical wall 54 and cover 56. Plasma processing gases are introduced via inlets 34 into reactor chamber 32. Plasma etching gases are introduced into chamber 32 through inlets 44—44. A water cooled cathode 36 is connected to an RF power supply 38 at 13.56 MHz. An anode 39 is connected to the walls 31 which are grounded by line 40. Helium gas is supplied-through passageway 50 through cathode 36 to the space beneath wafer 10 which is supported peripherally by lip seal 52 so that the helium gas cools the wafer 10. The wafer 10 is supported by a wafer support 46 that includes a plurality of clamps (not shown) which hold down the upper surface of wafer 10 at its periphery, as is well known to those skilled in the art. A pair of helmholtz configured electromagnetic coils 42 and 43 provide north and south poles within the chamber 32 and are disposed at opposite ends of the lateral cylindrical wall 54 and the walls 31. The electromagnetic coils 42 and 43 provide a transverse magnetic field with the north and south poles at the left and right providing a horizontal magnetic field axis parallel to the surface of the wafer 10. The transverse magnetic field is applied to slow. the vertical velocity of the electrons which are accelerated radially by the magnetic field as they move towards the wafer 10. Accordingly, the quantity of electrons in the plasma 33 is increased by means of the transverse magnetic field and the plasma 33 is enhanced as is well known to these skilled in the art.

The electromagnetic coils 42 and 43 which provide the magnetic field are independently controlled to produce a field intensity orientation which is uniform. The field can be stepped angularly around the wafer 10 by rotating the energization of the electromagnetic coils 42 and 43, sequentially. The transverse magnetic field provided by the electromagnetic coils 42 and 43 is directed parallel to the surface of the wafer 10 being treated by the plasma 33, and the cathode 36 of the plasma reactor 30 increases ionization efficiently of the electrons in the plasma 33. This provides the ability to decrease the potential drop across the sheath of the cathode 36 and to increase the ion current flux present on the surface of the wafer 10, thereby permitting higher rates of etching without requiring higher ion energies to achieve the result otherwise.

Figure 4:
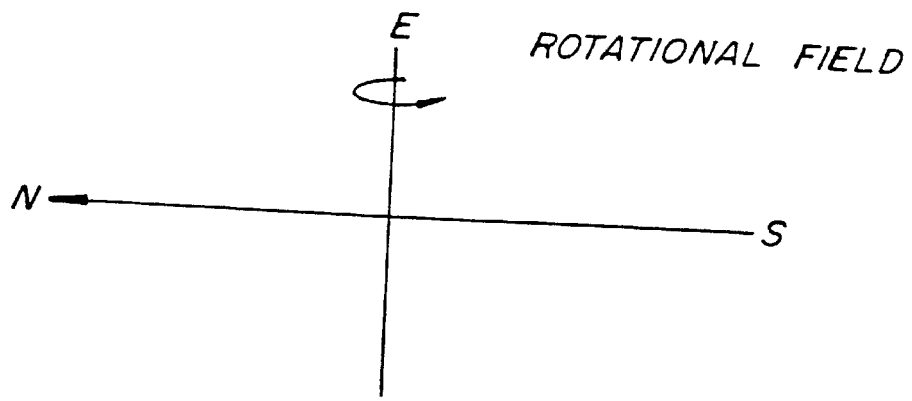
FIG. 4 is a diagram of a flux produced by a magnetic field and illustrated as rotating around a center axis.

The preferred magnetic source employed to achieve magnetically enhanced reactive ion etcher (RIE) used in practicing the present invention is a variable rotational field provided by the electromagnetic coils 42 and 43 arranged in a Helmholtz configuration. The electromagnetic coils 42 and 43 are driven by 3-phase AC currents. The magnetic field with Flux B is parallel to the wafer 10, and perpendicular to the electrical field as shown in FIG. 4. Referring to FIG. 4, the vector of the magnetic field H which produces flux B is rotating around the center axis of the electrical field by varying the phases of current flowing through the electromagnetic coils 42 and 43 at a typical rotational frequency of 0.01 to 1 Hz, particularly at 0.5 Hz. The strength of the magnetic flux B typically varies from 0 Gauss to about 150 Gauss and is determined by the quantities of the currents supplied to the electromagnetic coils 42 and 43. While FIG. 3 illustrates one plasma processing apparatus that is suitable for removing the insulation layer 18 (except insulation layer 18a), it is to be understood that other reactive ion etchers may be employed, such as electron cyclotron resonance (ECR), helicon resonance or inductively coupled plasma (ICP), triode etchers, etc.

The plasma 33 may employ any suitable etchant gas to break through (i.e. to clean and etch away) the insulation layer 18 except that insulation layer 18a below the resist 20, as best shown FIGS. 5 and 6. For example, if the insulation layer 18 contains silicon oxide, suitable etchant gas(es) may be selected from the group consisting of fluorine-containing gases (e.g. $CHF_3$, $SF_6$, $C_2F_6$, $NF_3$, etc.), bromine-containing gases (e.g. HBr, etc.), chlorine-containing gases (e.g. $CHCl_3$, etc.), rare gases (e.g. argon, etc.), and mixtures thereof. Preferably, the etchant does not include an oxidant, such as oxygen, since the purpose of this step is to remove the insulation layer 18 (except insulation layer 18a which is protected by resist 20) and not to remove the resist 20. More preferably, the etchant gas comprises from about 20% by volume to about 40% by volume $CHF^3$ and from about 60% by volume to about 80% by volume argon. The preferred reactor conditions for a suitable plasma processing apparatus (such as the plasma processing apparatus of FIG. 3) in removing the insulation layer 18 (except insulation layer 18a) are as follows:

| | |
|---|---|
| Pressure | 10–150 mTorr |
| RF Power | 500–1500 watts |
| Rotational Magnetic Field | 25–70 Gauss |
| Temperature of Wafer | 25–100° C. |
| Insulation Layer 18 Etch Rate | 2000–10,000 Angstroms/min |

The selectivity of insulation layer 18/resist 20 is better than 3:1, depending on the materials employed for the insulation layer 18 and the resist 20.

More generally, the process parameters for removing the insulation layer 18 in a suitable plasma process apparatus (such as the plasma processing apparatus of FIG. 3) fall into ranges as listed in the following Table III and based on flow rates of the gases $CHF_3$ and Ar also listed in the following Table III.

TABLE III

| Process | Broad | Preferred |
|---|---|---|
| Gas Flow, sccm | | |
| $CHF_3$ | 10 to 50 (20 to 40% by vol.) | 20 to 40 |
| Ar | 50 to 90 (60 to 80% by vol.) | 60 to 80 |
| Pressure, mT | 10 to 250 | 10 to 150 |
| 13.56 MHZ RF Power (Watts) | 500 to 2500 | 500 to 1500 |
| Temperature (° C.) of Wafer | 10 to 120 | 25 to 100 |
| Magnetic Field Gauss | 10 to 120 | 25 to 70 |

For the embodiment of the invention depicted in FIG. 2 wherein the protective layer 22 is disposed on the platinum electrode layer 16 between the insulation layer 18 and the platinum electrode layer 16, the protective layer 22 has to be removed after removal of the insulation layer 18 in order to expose the platinum electrode layer 16. The protective layer 22 may be removed by any suitable manner and/or with any suitable plasma processing apparatus (such as with the plasma processing apparatus of FIG. 3) including the plasma 33 employing a suitable etchant gas to break through and etch away the protective layer 22 except that protective layer 22a (see FIGS. 6 and 8) immediately be low the insulation layer 18a. For example, if TiN is used as the protective layer 22, suitable etchant gas(es) may be selected from the group consisting of $Cl_2$, $BCl_3$, Ar and mixtures thereof. More preferably, the etchant gas for breaking through and etching away the protective layer 22, except protective layer 22a, comprises from about 20% by volume to about 60% by volume $Cl_2$, from about 20% by volume to about 60% by volume $BCl_3$ and from about 10% by volume to about 30% by volume Ar. Suitable reactor conditions for a suitable plasma processing apparatus (such as the plasma processing apparatus of FIG. 3) to remove the protective layer 22 (except protective layer 22a) are the same as those previously stated reactor conditions for the removal of the insulation layer 18 (except insulation layer 18a). It is to be understood that other reactive ion etchers may be employed to remove the protective layer 22a, such as ECR, ICP, Helicon Resonance, etc. As will be further explained below, the protective layer 22a is for protecting the corners (identified as "16c" below) of an etched platinum electrode layer (identified as "16a" below) during the overetching process of the present invention. It is believed that the protective layer 22a not only protects the corners of an etched platinum electrode layer during the overetching process, but also assist in maintaining an existing platinum profile and could improve a platinum profile such that, by way of example only, a 75 degree platinum profile could be improved to a 77 degree platinum profile.

After the insulation layer 18 has been etched away from the surface of the platinum electrode layer 18 to expose the latter and such that the only remnant of the insulation layer 18 is the insulation layer 18a situated immediately below resist 20, the resist 20 is to be removed. The resist 20 may be removed at any suitable time, either before the etching of the platinum electrode layer 16, or after the etching of the platinum electrode layer 16 and either before the overetching step of the present invention or during the overetching step or after the overetching step. The same would hold true with respect to the embodiment of the invention illustrated in FIGS. 2, 6 and 8 in that after the protective layer 22 has been etched away from the surface of the platinum electrode layer 18 to expose the latter and such that the only remnant of the protective layer 22 is the protective layer 22a situated immediately below the insulation layer 18a, the resist 20 is to be removed. However, with respect to this embodiment of the present invention, the resist 20 may be removed before the etching away of protective layer 22. Alternatively, the resist 20 may be removed after (or simultaneously during) the removal of the protective layer 22. Typically, at least a portion of the resist 20 would be removed while the protective layer 22 is being etched away to expose the platinum electrode layer 16 that is not superimposed by the protective layer 22a, especially when an oxidant, such as oxygen, is employed in the etchant gas for breaking through and etching away the protective layer 22.

The resist 20 may be removed in any suitable manner such as by using oxygen plasma ashing which is well known to those skilled in the art. The resist 20 may be stripped from the insulation layer 18a with any suitable plasma processing apparatus, such as the plasma processing apparatus shown in FIG. 3 and employing a plasma containing an etchant gas comprising oxygen. The resist 20 has been removed from the insulation layer 18a in an advanced strip passivation (ASP) chamber of a plasma processing apparatus sold under the trade mark metal etch MxP Centura to Applied Materials, Inc. 3050 Bowers Avenue, Santa Clara, Calif. 95054-3299. In stripping the resist 20 from the insulation layer 18a, the ASP chamber may employ microwave downstream $O_2/N_2$ plasma with the following recipe: 120 second, 250° C., 1400W, 3000cc $O_2$, 300cc $N_2$ and 2 Torr.

Figure 7:
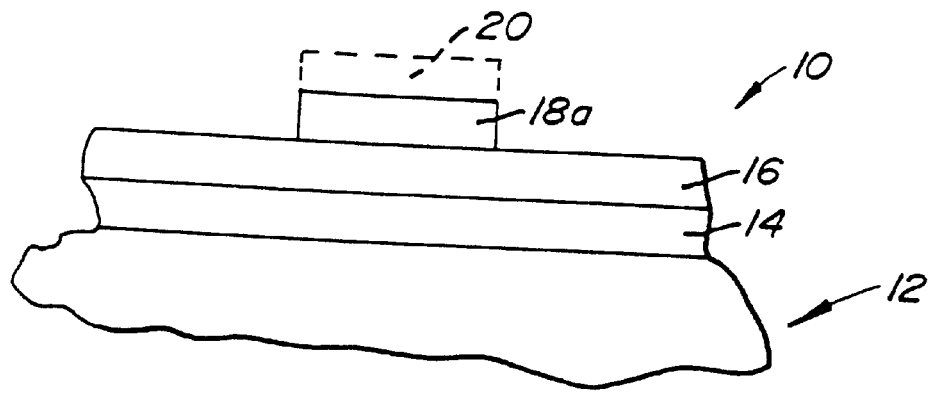
FIG. 7 is a side elevational view of the semiconductor wafer of FIG. 5 after the resist layer has been removed from a portion of the insulation layer with the removed resist layer being represented as broken lines.
Figure 8:
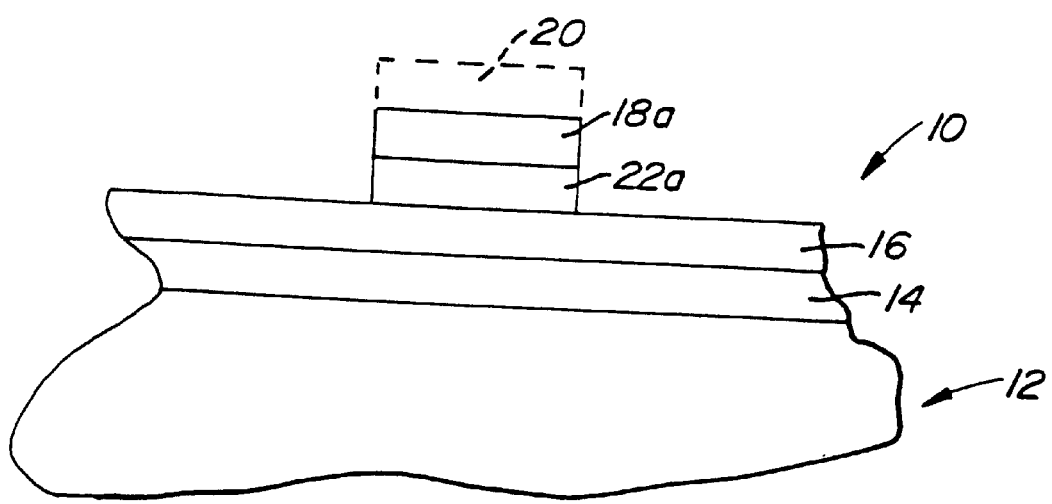
FIG. 8 is a side elevational view of the semiconductor wafer of FIG. 6 after etching and removing a portion of the protective layer off of the surface of the platinum layer, and after removing the resist layer from a portion of the insulation layer with the removed resist layer being represented as broken lines.

After the platinum electrode layer 16 has been exposed as represented in FIGS. 7 and 8, it is etched to develop a platinum profile. The platinum electrode layer 16 may be etched in any suitable plasma processing apparatus (such as the plasma processing apparatus of FIG. 3) or in the reactive ion etch (RIE) plasma processing apparatus sold under the trademark AME8100 Etch™, or under the trademark Precision Etch 5000™, or under the trademark Precision Etch 8300™, all trademarks owned by Applied Materials Inc., 3050 Bowers Avenue, Santa Clara, Calif. 95054-3299. Another suitable plasma processing apparatus for etching the platinum electrode layer 16 is that plasma processing apparatus sold under the trademark Metal Etch DPS Centura™ also owned by Applied Materials, Inc. It is also to be understood that other reactive ion etchers may be employed, such as ECR, ICP, Helicon Resonance, etc.

A suitable plasma processing apparatus for etching the platinum electrode layer 16 employs a plasma of an etchant gas, which is capable of producing good platinum profiles (e.g. platinum profiles greater than 70 degrees). Preferably, the etchant gas is selected from the group consisting of argon, oxygen, chlorine and mixtures thereof. More preferably, the etchant gas comprises oxygen and argon. More preferably, the etchant gas consist essentially of argon; that is, the etchant gas is essentially 100% (i.e. greater than about 99.9%) by volume argon. Argon plasmas are known to have a high energetic ion concentration and are often used for physical sputtering. The sputtering effect due to the ions is a function of the accelerating potential which exist between the plasma and the sample.

The preferred reactor conditions for a suitable plasma processing apparatus (such as the plasma processing apparatus of FIG. 3) in etching the platinum electrode layer 16 are as follows:

| Pressure | 10~50 mTorr |
|---|---|
| RF Power | 600~1000 watts |
| Rotational Magnetic Field | 20~100 Gauss |
| Temperature of Wafer | 80~140° C. |
| Platinum Layer 16 Etch Rate | 300–1500 Angstroms/min |

The selectivity of platinum electrode layer 16/insulation 18 is better than 2:1, depending on the materials employed for the insulation layer 18.

More generally, the process parameters for etching the platinum electrode 16 in a suitable plasma processing apparatus, such as the plasma process apparatus of FIG. 3, fall into ranges as listed in the following Table IV and based on the flow rate of essentially 100% by volume Ar gas as also listed in Table IV below:

TABLE IV

| Process | Broad | Preferred | Optimum |
| --- | --- | --- | --- |
| Gas Flow, sccm | | | |
| Ar | 50 to 150 | 75 to 125 | 80 to 110 |
| Pressure, mT | 10 to 100 | 10 to 40 | 10 to 20 |
| 13.56 MHz RF Power (Watts) | 300 to 2000 | 500 to 1200 | 700 to 900 |
| Temperature (° C.) of Wafer | 20 to 150 | 60 to 120 | 80 to 110 |
| Magnetic Field Gauss | 0 to 140 | 20 to 100 | 60 to 80 |

Figure 9:
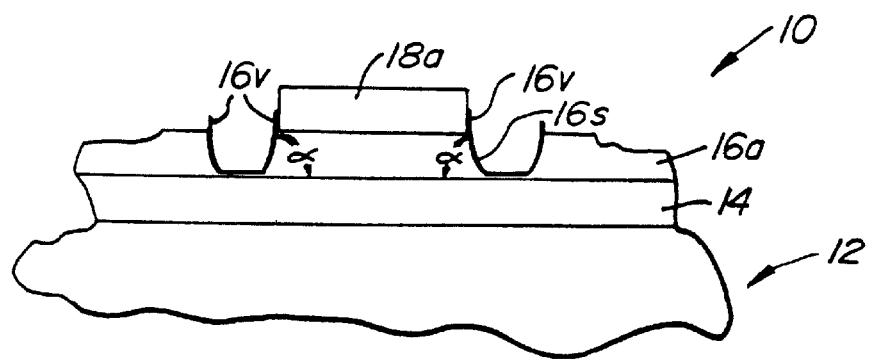
FIG. 9 is a side elevational view of the semiconductor wafer of FIG. 7 after the platinum electrode layer has been etched to produce an etched platinum electrode layer having redeposited veils which were formed during the etching of platinum electrode layer.
Figure 10:
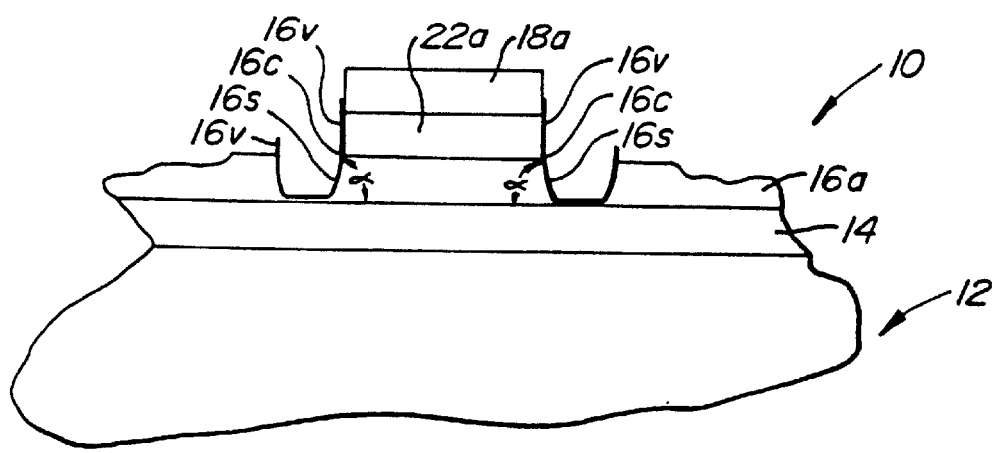
FIG. 10 is a side elevational view of the semiconductor wafer of FIG. 8 after the platinum electrode layer has been etched to produce an etched platinum electrode layer having redeposited veils which were formed during the etching of platinum electrode layer.
Figure 11:
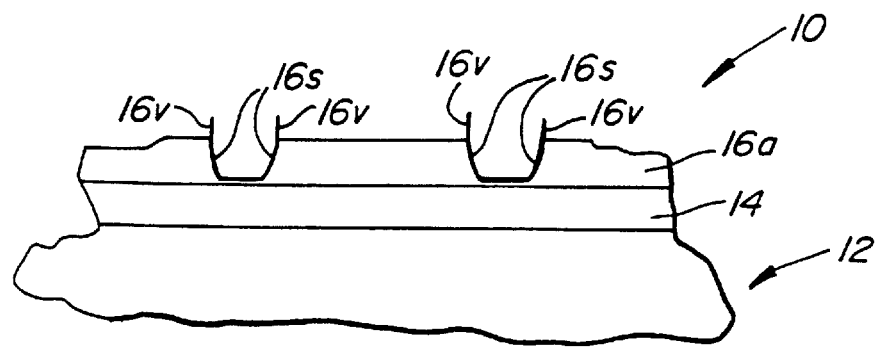
FIG. 11 is a side elevational view of the semiconductor wafer of FIG. 9 with the insulation layer removed to show the redeposited veils extending above the etched platinum electrode layer.
Figure 12:
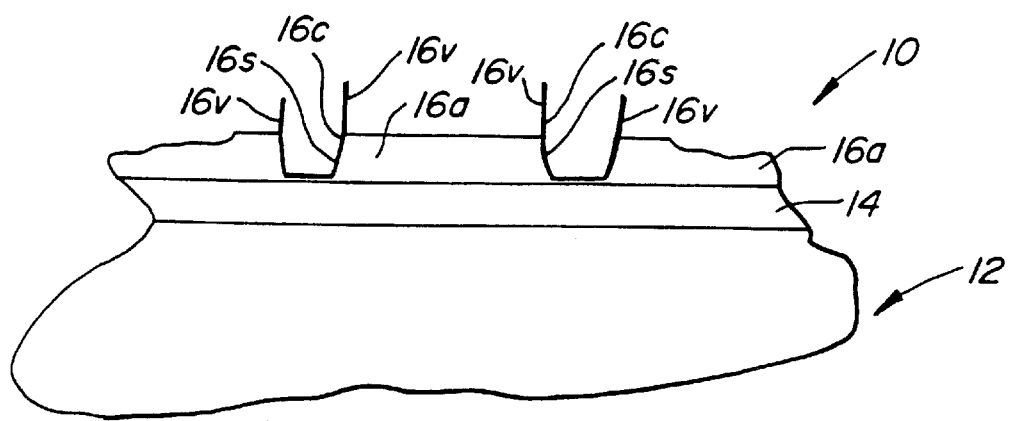
FIG. 12 is a side elevational view of the semiconductor wafer of FIG. 10 with the insulation layer and protective layer removed to show the redeposited veils extending above the etched platinum electrode layer.

As previously indicated, the preferred etchant gas for etching the platinum electrode layer 16 is essentially 100% by volume argon. If the etchant gas is essentially 100% by volume argon, the plasma processing apparatus for etching the platinum electrode layer 16 etches the platinum electrode layer 16 at a high platinum etch rate (i.e. an etch rate higher than 1000 Å/min) and produces an etched platinum electrode layer 16a (as best shown in FIGS. 9 and 10) with corners 16c, redeposited sidewalls 16s and a good platinum profile; that is, a platinum profile where the angle of the sidewalls 16s (as also best shown in FIGS. 9 and 10) with respect to a horizontal plane is greater than about 70 degrees. The disadvantages of employing essentially 100% argon as the etchant gas is that redeposited veils 16v are formed during the etching of the platinum electrode layer 16. The veils 16v are essentially an extension of the redeposited sidewalls 16s and protrude above the etched platinum electrode layer 16a as best shown in FIGS. 9–12. Adding oxygen and/or chlorine to the argon etchant gas minimizes the formation of redeposited veils 16v and redeposited sidewalls 16s, but the profile angle decreases.

The veils 16v are removed from the etched platinum electrode layer 6a by overetching the etched platinum electrode layer 16a in a high density plasma chamber containing a high density plasma of an etchant gas preferably selected from the group consisting of oxygen, chlorine and mixtures thereof. If a mixture of oxygen and chlorine are used as the etchant gas for a high density plasma, the etchant gas comprises from about 50% by volume to about 100% by volume oxygen and from about 0% by volume to about 50% by volume chlorine; more preferably from about 75% by volume to about 85% by volume oxygen and from about 15% by volume to about 25% by volume chlorine; most preferably about 80% by volume oxygen and about 20% by volume chlorine. The high density plasma of the present invention may be defined as a plasma of an etchant gas having an ion density greater than about $10^9/cm^3$, preferably greater than about $10^{11}/cm^3$.

The source of the high density plasma may be any suitable high density source, such as electron cyclotron resonance (ECR), helicon resonance or inductively coupled plasma (ICP)-type sources. All three are in use on production equipment today. The main difference is that ECR and helicon sources employ an external magnetic field to shape and contain the plasma, while ICP sources do not.

The high density plasma for the present invention is preferably produced or provided by inductively coupling a plasma in a decoupled plasma source etch chamber, such as that sold under the trademark DPS™ owned by Applied Materials, Inc. which decouples or separates the ion flux to the wafer 10 and the ion acceleration energy. The design of the etch chamber provides fully independent control of ion density of an enlarged process window. This is accomplished by producing plasma via an inductive source. While a cathode within the etch chamber is still biased with rf electric fields to determine the ion acceleration energy, a second rf source (i.e. an inductive source) determines the ion flux. This second rf source is not capacitive (i.e. it does not use electric fields like the cathode) since a large sheath voltage would be produced, interfering with the cathode bias and effectively coupling the ion energy and ion flux.

The inductive plasma source couples rf power through a dielectric window rather than an electrode. The power is coupled via rf magnetic fields (not electric fields) from rf current in a coil. These rf magnetic fields penetrate into the plasma and induce rf electric fields (therefore the term "inductive source") which ionize and sustain the plasma. The induced electric fields do not produce large sheath voltages like a capacitive electrode and therefore the inductive source predominantly influences ion flux. The cathode bias power plays little part in determining ion flux since most of the rf power (typically an order of magnitude less than the source power) is used in accelerating ions. The combination of an inductive plasma source and a capacitive wafer bias allows independent control of the ion flux and ion energy reaching the wafer 10 in the etch chamber, such as the DPS™ brand etch chamber.

Figure 17:
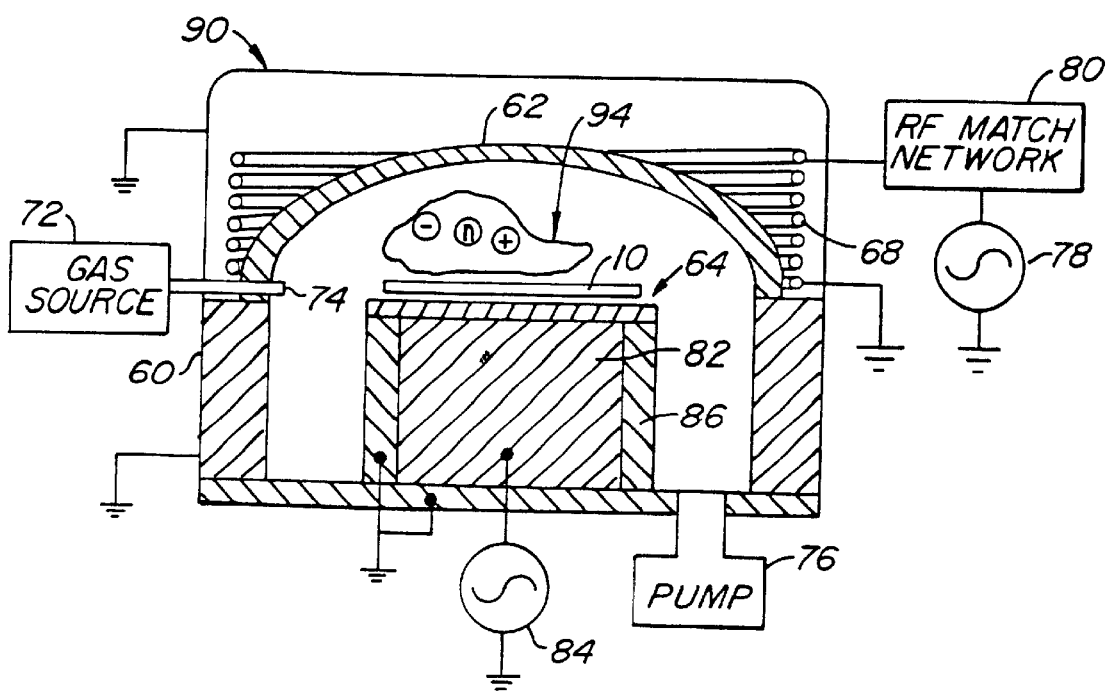
FIG. 17 is a simplified cut-away view of an inductively coupled RF plasma reactor which may be employed in overetching the etched platinum electrode layer to remove the redeposited veils associated therewith.
Figure 18:
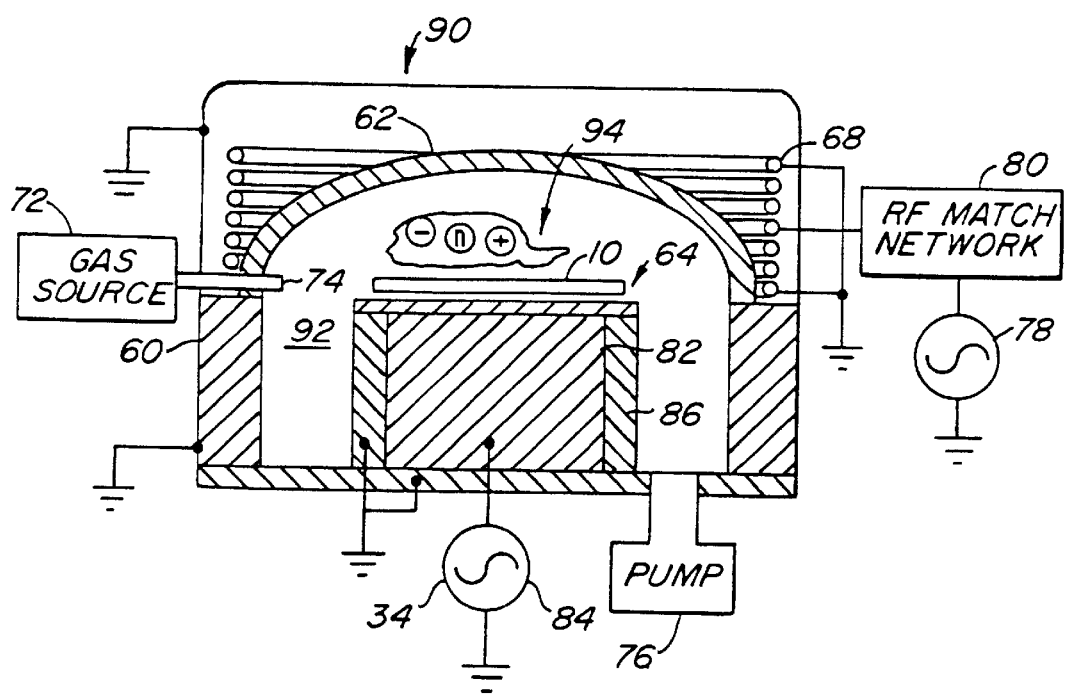
FIG. 18 is a simplified cut-away view of another inductively coupled RF plasma reactor which may be employed in overetching the etched platinum electrode layer to remove the redeposited veils associated therewith.

DPS™ brand etch chambers for producing the high density plasma of the present invention to remove the veils 16v from the etched platinum electrode layer 16a may be any of the DPS™ brand etch chambers of the inductively coupled plasma reactor disclosed in co-pending U.S. Pat. No. 5,753,044, entitled "RF PLASMA REACTOR WITH HYBRID CONDUCTOR AND MULTI-RADIUS DOME CEILING" and assigned to the present assignee and fully incorporated herein by reference thereto as if repeated verbatim immediately hereinafter. Referring now to FIGS. 17 and 18 for two (2). embodiments of an inductively coupled plasma reactor from U.S. Pat. No. 5,753,044 there is seen an inductively coupled RF plasma reactor generally illustrated as 90, having a reactor chamber, generally illustrated as 92, wherein a high density plasma 94 of neutral (n) particles, positive (+) particles, and negative (−) particles are found. The reactor chamber 92 has a grounded conductive cylindrical sidewall 60 and a dielectric ceiling 62. The inductively coupled RF plasma reactor 90 further comprises a wafer pedestal 64 for supporting the (semiconductor) wafer 10 in the center of the chamber 92, a cylindrical inductor coil 68 surrounding an upper portion of the chamber 92 beginning near the plane of the top of the wafer 10 or wafer pedestal 64 and extending upwardly therefrom toward the top of the chamber 92, an etching gas source 72 and gas inlet 74 for furnishing an etching gas into the interior of the chamber 92, and a pump 76 for controlling the pressure in the chamber 92. The coil inductor 68 is energized by a plasma source power supply or RF generator 78 through a conventional active RF match network 80, the top winding of the coil inductor 68 being "hot" and the bottom winding being grounded. The wafer pedestal 64 includes an interior conductive portion 82 connected to the bias RF power supply or generator 84 and an exterior grounded conductor 86 (insulated from the interior conductive portion 82). Thus, the plasma source power applied to the coil inductor 68 by the RF generator 78 and the DC bias RF power applied to the wafer pedestal 64 by generator 84 are separately controlled RF supplies. Separating the bias and source power supplies facilitates independent control of ion density and ion energy, in accordance with well-known techniques. To produce high density plasma 94 as an inductively coupled plasma, the coil inductor 68 is adjacent to the chamber 92 and is connected to the RF source power supply or the RF generator 78. The coil inductor 68 provides the RF power which ignites and sustains the high ion density of the high density plasma 94. The geometry of the coil inductor 68 can in large part determine spatial distribution of the plasma ion density of the high density plasma 94 within the reactor chamber 92.

Uniformity of the plasma density spatial distribution of the high density plasma 94 across the wafer 10 is improved (relative to conical or hemispherical ceilings) by shaping the ceiling 62 in a multi-radius dome and individually determining or adjusting each one of the multiple radii of the ceiling 62. The multiple-radius dome shape in the particular embodiment of FIG. 17 somewhat flattens the curvature of the ceiling 62 around the center portion of the ceiling 62, the peripheral portion of the ceiling 62 having a steeper curvature.

As illustrated in FIG. 18 the coil inductor 68 may be coupled to the RF power source 78, 80 in a mirror coil configuration that is known to those skilled in the art. In the mirror coil configuration of FIG. 18, the RF source 78, 80 is connected to the center winding of the coil inductor 68 while the top and bottom ends of the coil inductor 68 are both grounded. The mirror coil configuration has the advantage of reducing the maximum potential on the coil inductor 68.

It has been discovered that by employing a high density plasma, such as the high density plasma 94 illustrated in FIGS. 17 and 18, for overetching the etched platinum electrode layer 16a, the veils 16v are preferentially removed from the etched platinum electrode layer 16a over the removal of the sidewalls 16s. The veils 16v are etched both vertically and laterally whereas the sidewalls 16s are essentially etched only laterally since the veils 16v are superimposed over and on the sidewalls 16s, protecting the sidewalls 16s from vertical etching. Stated alternatively, the veils 16v are exposed both in a vertical or perpendicular direction and in a lateral or transverse direction to the ions in the high density plasma (e.g. high density plasma 94) whereas the sidewalls 16s are generally exposed only in a lateral or transverse direction to the ions because the veils 16v obstruct the sidewalls 16s from being etched in a vertical or perpendicular direction. Therefore, when the platinum etched wafer structure of FIG. 9 or FIG. 10 is disposed into a high density plasma chamber, such as reactor chamber 92 in FIG. 17 or FIG. 18, and etched (i.e. overetched) with a high density plasma, such as the high density plasma 94 illustrated in FIGS. 17 and 18, the overall etch rate (i.e. the total etch rate from both vertical and lateral etching) on the veils 16v is greater than the essentially lateral or transverse etch rate on the sidewalls 16s. Thus, the veils 16v may be completely removed while maintaining a good platinum profile (i.e. the angle in FIGS. 9 and 10 remains greater than about 70 degrees) since the sidewalls 16s are not etched or overetched to the same extent that the veils 16v are etched or overetched in their removal. It is desired that the etching and/or removal of the veils 16v be conducted with a high etch rate, preferably with the highest etch rate as possible, without damaging the platinum profile. It is also desired that any etching and/or removal of sidewalls 16s be conducted such as to preserve and/or improve the platinum profile, especially when sidewall etching is conducted in the embodiment of the present invention employing the protective layer 22a. In a preferred embodiment of the invention, the etch rate on the veils 16v ranges from about 200 Å/min to about 2000 Å/min, more preferably from about 200 Å/min to about 1000 Å/min. The etch rate on the sidewalls 16s may range from about 0 Å/min to about 300 Å/min, and is preferably from about 0 Å/min to about 100 Å/min, more preferably from about 0 Å/min to about 50 Å/min. The preferred reactor conditions for a suitable inductively coupled RF plasma reactor, such as the inductively coupled RF plasma reactor 90 in FIGS. 17 and 18, in overetching the etched platinum electrode layer 16a to remove the veils 16v are as follows:

| | |
|---|---|
| Pressure | 7 to 10 mTorr |
| RF Power to Coil Inductor | 750 to 1000 watts |
| RF Power to Wafer Pedestal | 300 to 400 watts |
| RF Frequency in Coil Inductor | 2 to 13.5 MHz |
| RF Frequency in Wafer Pedestal | 400K to 13.5 MHz |
| Temperature of Wafer | 100 to 130° C. |
| Veil Etch Rate | 300 to 700 Angstrom/min |
| Sidewall Etch Rate | 0 to 50 Angstrom/min |

The selectivity of etched platinum electrode layer 16a/insulation layer 18 is better than 2:1, depending on the materials employed for the insulation layer 18. More generally, the process parameters for removing the veils 16v from the etched platinum electrode layer 16a in a suitable inductively coupled plasma reactor, such as the inductively coupled plasma reactor 90 in FIGS. 17 and 18 fall into ranges as listed on the basis of flow rates of the gases $Cl_2$ and $O_2$ as listed in Table V below.

TABLE V

| Process | Broad | Preferred | Optimum |
|---|---|---|---|
| Gas Flow, sccm | | | |
| $Cl_2$ | 0 to 100 | 10 to 40 | 20 to 30 |
| $O_2$ | 50 to 300 | 80 to 135 | 85 to 120 |
| Pressure, mT | 0.5 to 40 | 5 to 15 | 7 to 10 |
| RF Power of Coil Inductor (Watts) | 100 to 3000 | 650 to 1200 | 750 to 1000 |
| RF Power of Wafer Pedestal (Watts) | 50 to 1500 | 200 to 500 | 300 to 400 |
| Temperature (° C.) of Wafer | 20 to 500 | 100 to 300 | 100 to 130 |
| Veil Etch Rate (Å/min) | 200 to 2000 | 200 to 1000 | 300 to 700 |
| Sidewall Etch Rate (Å/min) | 0 to 300 | 0 to 100 | 0 to 50 |
| RF Frequency of Coil Inductor | 100K to 200 MHz | 400K to 20 MHz | 2 to 13.5 MHz |
| RF Frequency of Wafer Pedestal | 100K to 200 MHz | 400K to 20 MHz | 400K to 13.5 MHz |

Figure 13:
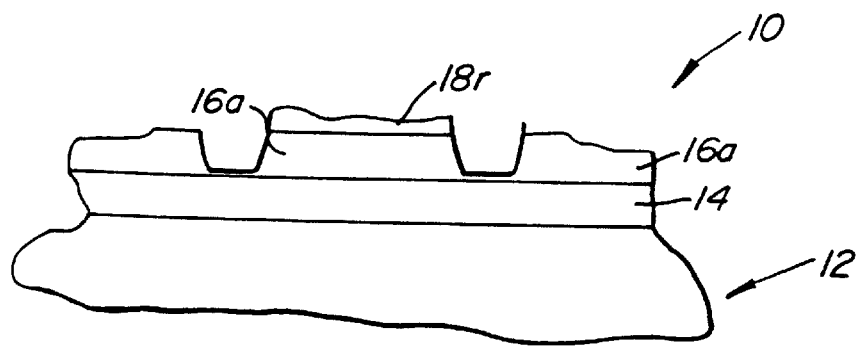
FIG. 13 is a side elevational view of the semiconductor wafer of FIG. 9 after the etched platinum electrode layer has been overetched to remove the redeposited veils and illustrating a portion of the insulation layer having been removed during the overetching of the etched platinum electrode.
Figure 14:
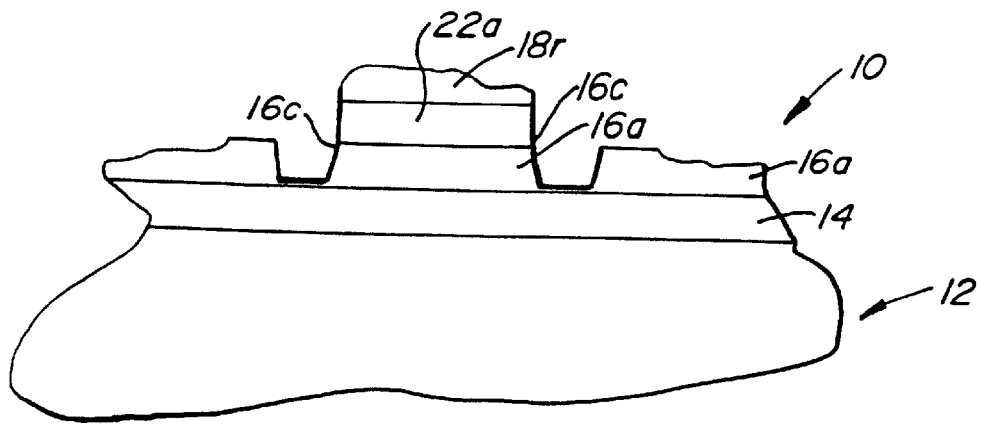
FIG. 14 is a side elevational view of the semiconductor wafer of FIG. 10 after the etched platinum electrode layer has been overetched to remove the redeposited veils and illustrating a portion of the insulation layer having been removed during the overetching of the etched platinum electrode.

Therefore, the foregoing process conditions are preferably based on flow rates of etchant gas(es) having a flow rate value ranging from about 50 to about 200 sccm. As previously mentioned, the etchant gas(es) comprises up to about 100% by volume oxygen, preferably from about 50 to about 100% by volume oxygen, more preferably from about 0 to about 50% by volume chlorine and from about 50 to about 100% by volume oxygen. Thus, the foregoing process conditions may be based on such etchant gas constituency and on such percent (%) by volume value(s). For the embodiment of the invention illustrated in FIGS. 2, 6, 8 and 10, the protective layer 22a protects the corners 16c of the etched platinum electrode layer 16a during the overetching process. Typically, and as best shown in FIGS. 13 and 14, some of the insulation layer 18a is etched during the overetching process, leaving a residual insulation layer 18r on top of etched platinum electrode layer 16a, or on top of the protective layer 22a, after removal of the veils 16v. The protective layer 22a insures that the corners 16c of the etched platinum electrode layer 16a are protected during overetching, especially in the event that the overetching process removes essentially all of the insulation layer 18a. Maintaining the corners 16c of the etched platinum electrode layer 16a protects the quality of the platinum profile formed during etching of the platinum electrode layer 16 to produce the etched platinum electrode layer 16a.

After the veils 16v have been removed from the etched platinum electrode layer 16a, the residual insulation layer 18r (if not completely removed during the overetching process) typically remains on top of the veil-less etched platinum electrode layer 16a, or on top of the protective layer 22a which is supported by the veil-less etched platinum electrode layer 16a, all as best shown in FIGS. 13 and 14. The residual insulation layer 18r is to be removed by any suitable means and/or in any suitable manner, such is by $CHF_3/Ar$ plasma. Likewise for the embodiment of the invention depicted in FIG. 14, the protective layer 22a is to be removed after removal of the residual insulation layer 18r from the protective layer 22a. The protective layer 22a. may be removed by any suitable means and/or in any suitable manner. For example, when the protective layer 22a comprises TiN removal is by $Ar/Cl_2$ plasma in a DPS™ brand chamber of the Metal Etch DPS Centura™ brand plasma processing apparatus under the following apparatus and process conditions as listed in Table VI below.

TABLE VI

| Process | Broad | Preferred | Optimum |
| --- | --- | --- | --- |
| Gas Flow, sccm | | | |
| $Cl_2$ | 20 to 150 | 30 to 120 | 40 to 100 |
| Ar | 20 to 100 | 30 to 80 | 40 to 60 |
| Pressure, mT | 0.5 to 40 | 4 to 30 | 7 to 14 |
| RF Power of Coil Inductor (Watts) | 500 to 3000 | 500 to 2000 | 800 to 1200 |
| RF Power of Wafer Pedestal (Watts) | 50 to 500 | 50 to 300 | 50 to 150 |
| Temperature (° C.) of Wafer | 20 to 500 | 20 to 150 | 80 to 130 |
| TiN Etch Rate (Å/min) | 500 to 5000 | 1000 to 3500 | 1500 to 2500 |
| RF Frequency of Coil Inductor | 100K to 200 MHz | 400K to 20 MHz | 2 to 13.5 MHz |
| RF Frequency of Wafer Pedestal | 100K to 200 MHz | 400K to 20 MHz | 400K to 13.5 MHz |

Figure 15A:
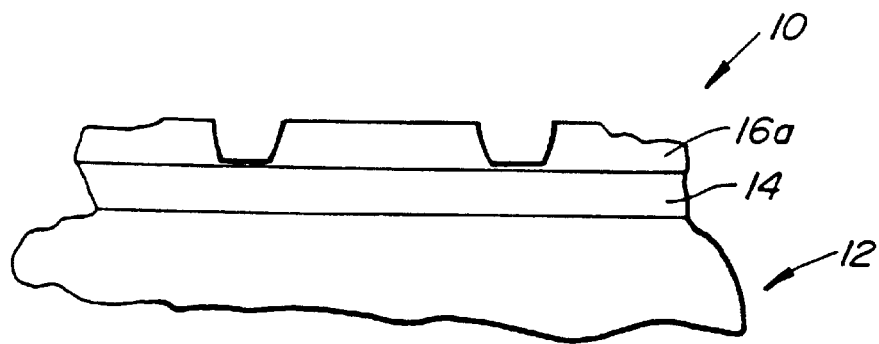
FIG. 15A is a side elevational view of the semiconductor wafer of FIG. 13 after the residual insulation layer has been removed from the surface of the etched platinum electrode layer.
Figure 16A:
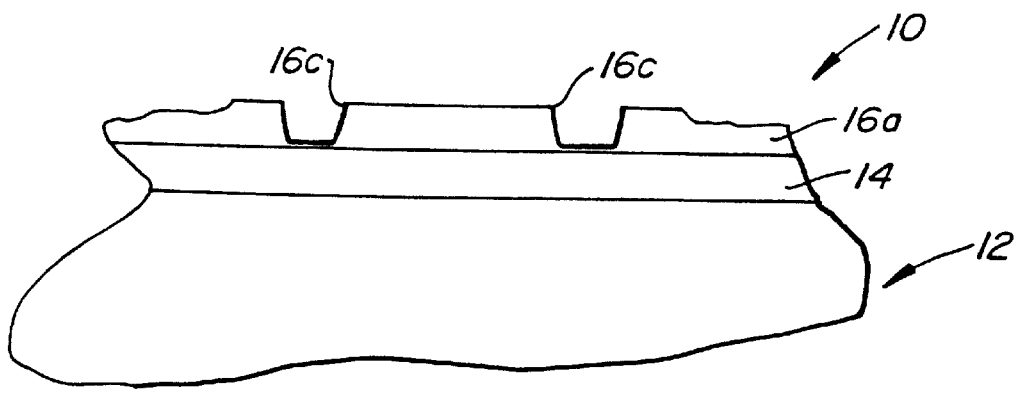
FIG. 16A is a side elevational view of semiconductor wafer of FIG. 14 after the residual insulation layer and the protective layer have been removed from the surface of the etched platinum electrode layer.
Figure 15B:
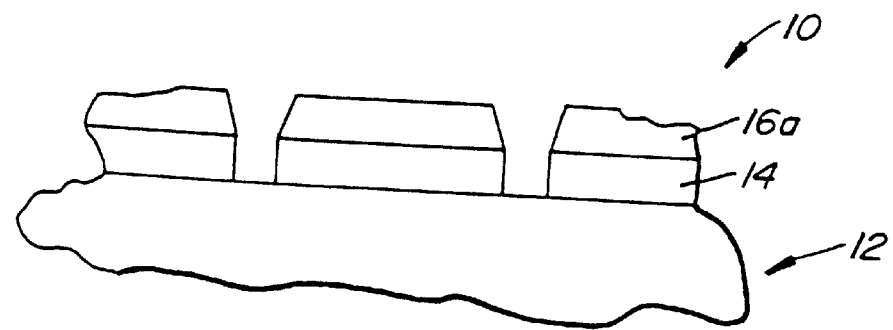
FIG. 15B is a side elevational view of the semiconductor of FIG. 13 after the residual insulation layer has been removed from the surface of the etched platinum electrode layer and with the barrier layer having been etched.
Figure 16B:
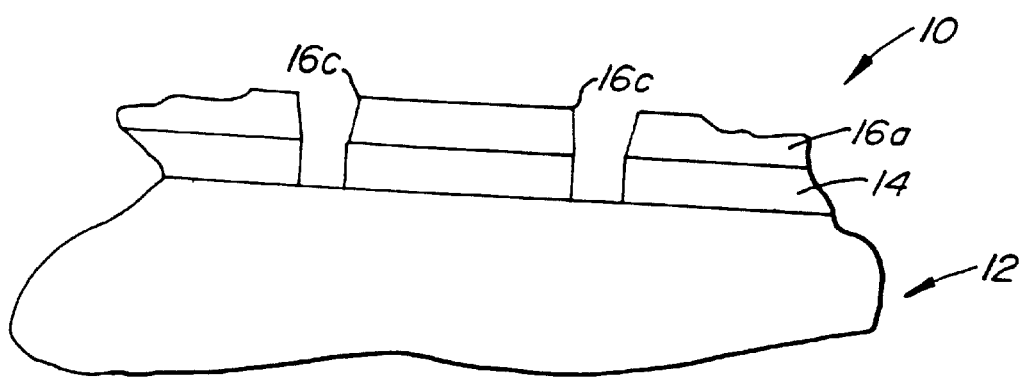
FIG. 16B is a side elevational view of semiconductor wafer of FIG. 14 after the residual insulation layer and the protective layer have been removed from the surface of the etched platinum electrode layer and with the barrier layer having been etched.

After removal of residual insulation layer 18r, or the residual insulation layer 18r and the protective layer 22a for the embodiment of the invention illustrated in FIG. 14, the veil-less etched platinum electrode layered structure of FIG. 15A or FIG. 16A remains. It should be noted, as best shown in FIGS. 15B and 16B respectively, that the barrier layer 14 could be etched simultaneously during or after removal of the residual insulation layer 18r (see FIG. 15B), or etched simultaneously during or after removal of the residual insulation layer 18r and the protective layer 22a (see FIG. 16B).

It is to be understood that the resist 20 for the embodiment of the invention depicted in FIG. 1, or the resist 20 and/or the insulation layer 18a for the embodiment of the invention depicted in FIG. 2, may be removed at any suitable time, such as during the etching of the platinum electrode layer 16 or after the etching of the platinum electrode layer 16.

Similarly, the insulation layer 18a and/or resist 20 for the embodiment of the invention depicted in FIG. 1, or protective layer 22a and/or insulation layer 18a and/or resist 20 for the embodiment of the invention depicted in FIG. 2, may also be removed at any suitable time, such as during the overetching process or after the overetching process.

The invention will be illustrated by the following set forth example which is being given to set forth the presently known best mode and by way of illustration only and not by way of any limitation. All parameters such as concentrations, mixing proportions, temperatures, pressure, rates, compounds, etc., submitted in this example are not to be construed to unduly limit the scope of the invention.

EXAMPLE

A test semiconductor wafer was formulated with the following film stack:

0.7 μm PR (photoresist)/2500 Å Oxide/300 Å TiN/1500 Å Pt/100 Å Ti

The feature size of the formulated test semiconductor wafer was 0.4 1μm block and 0.2 μm spacing. The oxide hard mask (i.e. the insulation layer) was opened in the oxide etch chamber of a plasma processing apparatus sold under the trademark Oxide Etch MxP Centura™, owned by Applied Materials Inc., 3050 Bowers Avenue, Santa Clara, Calif. 95054-3299. The etchant gas for opening up the oxide hard mask comprised about 70% by volume Ar and about 30% by volume $CHF_3$. The reactor and process conditions were as follows:

| Reactor Conditions | |
| --- | --- |
| Pressure | 60 mTorr |
| RF Power | 850 watts |
| Rotational Magnetic Field | 40 Gauss |
| Temperature of Test Wafer | 100° C. |
| Oxide Hard Mask Etch Rate | 3000 Å/min |
| Process Conditions Based on the Flow Rate of Ar and $CHF_3$ | |
| $CHF_3$ | 50 sccm |
| Ar | 100 sccm |
| Pressure, mTorr | 60 mTorr |
| RF Power Density | 850 watts |
| Temperature (° C.) of Test Wafer | 100° C. |
| Oxide Mask Etch Rate (Å/min) | 3000 Å/min |
| Magnetic Field (Gauss) | 40 Gauss |

The photoresist was stripped from the oxide hard mask in an ASP chamber of the Metal Etch MxP Centura™ brand plasma processing apparatus under the following recipe using microwave downstream $O_2/N_2$ plasma: 120 seconds, 250° C., 1400 W, 3000 sccm $O_2$, 300 sccm $N_2$, and 2 Torr.

The TiN protective layer was etched with Ar and $Cl_2$ as the etchant gases and in a DPS™ brand chamber of the Metal Etch DPS Centura™ brand plasma processing apparatus under the following reactor and process conditions:

| Reactor Conditions | |
| --- | --- |
| Pressure | 7 mTorr |
| RF Power to Coil Inductor | 900 watts |
| RF Power to Wafer Pedestal | 100 watts |
| Temperature of Test Wafer | 110° C. |
| TiN Etch Rate | 2000 Å/min |

-continued

| Process Conditions Based on the Flow Rate of Ar and Cl$_2$ | |
|---|---|
| Ar | 25 sccm |
| Cl$_2$ | 50 sccm |
| Pressure | 7 mTorr |
| RF Power to Coil Inductor | 900 watts |
| RF Power to Wafer Pedestal | 100 watts |
| Temperature of Test Wafer | 110° C. |
| TiN Etch Rate | 2000 Å/min |

The platinum layer of the test semiconductor wafer was then etched with Ar as the etchant gas and in a DPS™ brand chamber of the Metal Etch DPS Centura™ brand plasma processing apparatus under the following reactor and process conditions:

| Reactor Conditions | |
|---|---|
| Pressure | 7 mTorr |
| RF Power to Coil Inductor | 750 watts |
| RF Power to Wafer Pedestal | 400 watts |
| Temperature of Test Wafer | 120° C. |
| Platinum Etch Rate | 2000 Å/min |
| Process Conditions Based on the Flow Rate of Ar | |
| Ar (100% by vol.) | 100 sccm |
| Pressure, mTorr | 7 mTorr |
| RF Power to Coil Inductor | 750 watts |
| RF Power to Wafer Pedestal | 400 watts |
| Temperature (° C.) of Test Wafer | 120° C. |
| Pt Etch Rate (Å/min) | 2000 Å/min |
| Selectivity of Pt/Oxide Hard Mask | 2:1 |

Figure 19:
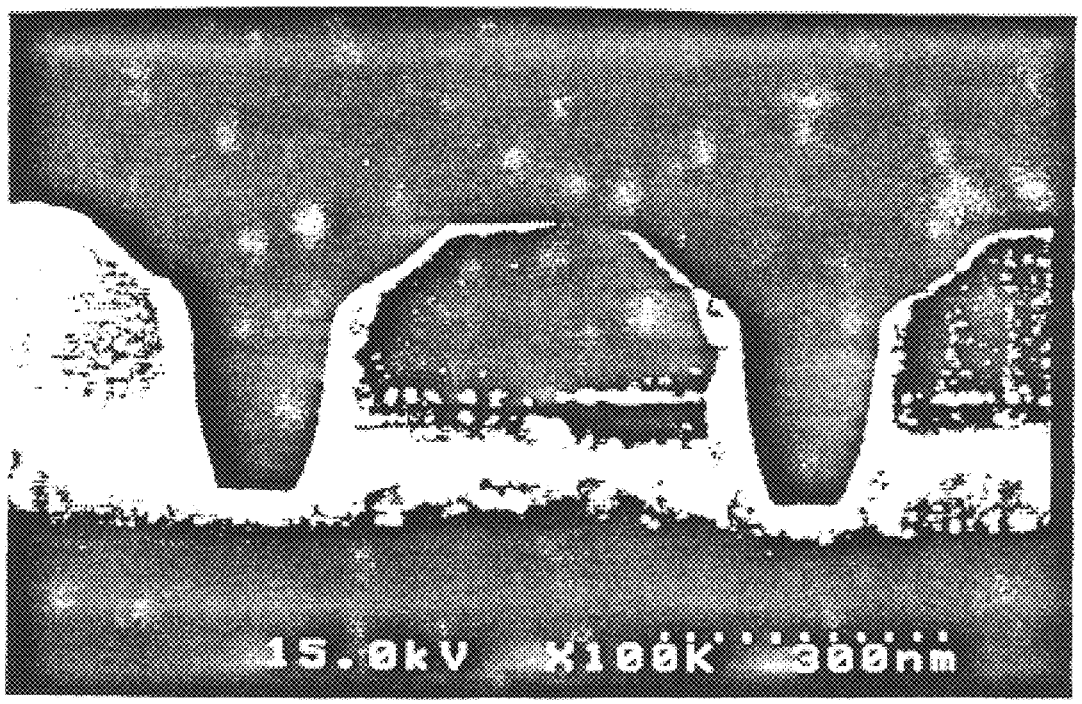
FIG. 19 is a picture showing an elevational view of a test semiconductor wafer for the Example after the platinum electrode layer was etched in accordance with the process conditions listed in the Example and illustrating the redeposited veils which were formed during the etching of the platinum electrode layer.

The resulting etched platinum layer of the test semiconductor wafer is shown in FIG. 19 wherein a platinum profile of about 75 degrees is shown with redeposited veils having height of about 1100 Angstroms and redeposited sidewalls having a thickness of about 300 Angstroms.

The redeposited veils of the etched platinum layer were subsequently removed in a high density plasma chamber of a plasma processing apparatus sold under the trademark DPS, also owned by Applied Materials Inc. The etchant gas comprised about 80% by volume O$_2$ and about 20% by volume Cl$_2$ and the reactor and process conditions were as follows:

| Reactor Conditions | |
|---|---|
| Pressure | 7 mTorr |
| RF Power to Coil Inductor | 750 watts |
| RF Power to Wafer Pedestal | 300 watts |
| Temperature of Test Wafer | 110° C. |
| Veil Etch Rate | 330 Angstrom/min |
| Sidewall Etch Rate | 30 Angstrom/min |
| RF Frequency of Coil Inductor | 2 to 13.5 MHz |
| RF Frequency of Wafer Pedestal | 400K to 13.5 MHz |
| Process Conditions Based on the flow rate of Cl$_2$ and O$_2$ | |
| Cl$_2$ | 20 sccm |
| O$_2$ | 80 sccm |
| Pressure, mTorr | 7 mTorr |
| RF Power to Coil Inductor | 750 watts |
| RF Power to Wafer Pedestal | 300 watts |
| Temperature (° C.) of Test Wafer | 110° C. |
| Veil Etch Rate (Å/min) | 330 Å/min |
| Sidewall Etch Rate (Å/min) | 30 Å/min |

-continued

| RF Frequency of Coil Inductor | 2 to 13.5 MHz |
|---|---|
| RF Frequency of Wafer Pedestal | 400K to 13.5 MHz |

Figure 20:
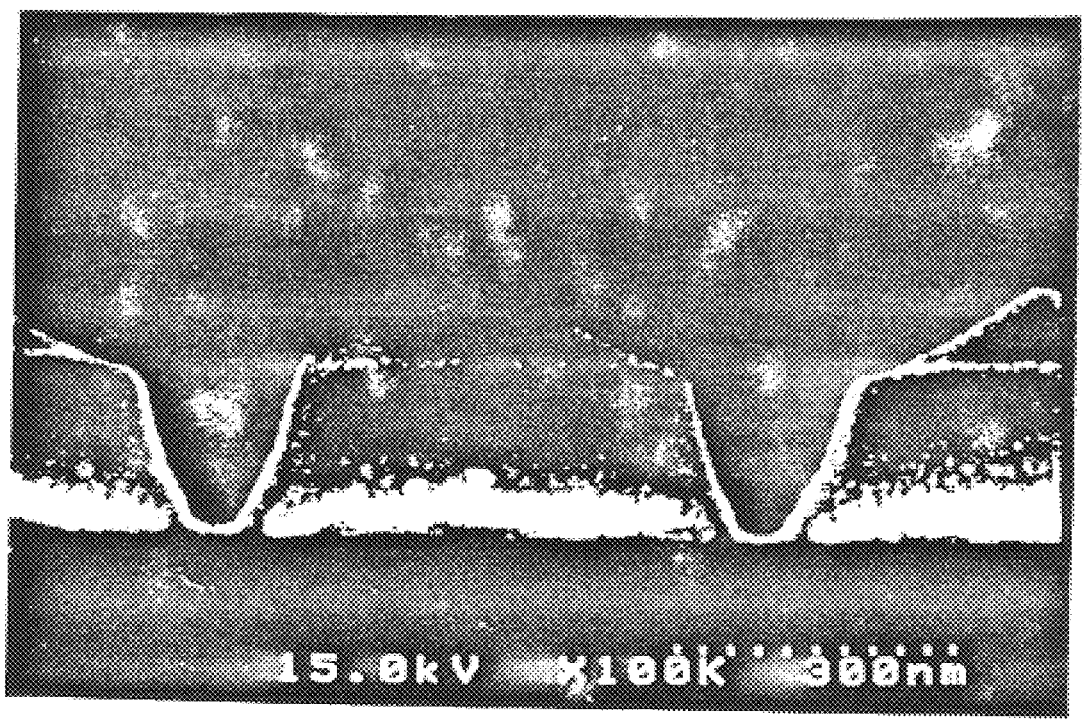
FIG. 20 is a picture showing an elevational view of the test semiconductor wafer of FIG. 19 after the etched platinum electrode layer was overetched in accordance with the process conditions listed in the Example to remove the redeposited veils and produce a veil-less etched platinum electrode layer.

The resulting semiconductor overetched platinum layer of the test semiconductor wafer is shown in FIG. 20. The redeposited veils have been removed and the redeposited sidewalls are now about 200 Angstrom thick. Thus, the overetching step removed all of the 1100 Angstroms veils and removed 100 Angstroms from the 300 Angstroms thick redeposited sidewalls. The Ti barrier layer was etched a little because the overetching step was conducted for too long a period of time.

Figure 21:
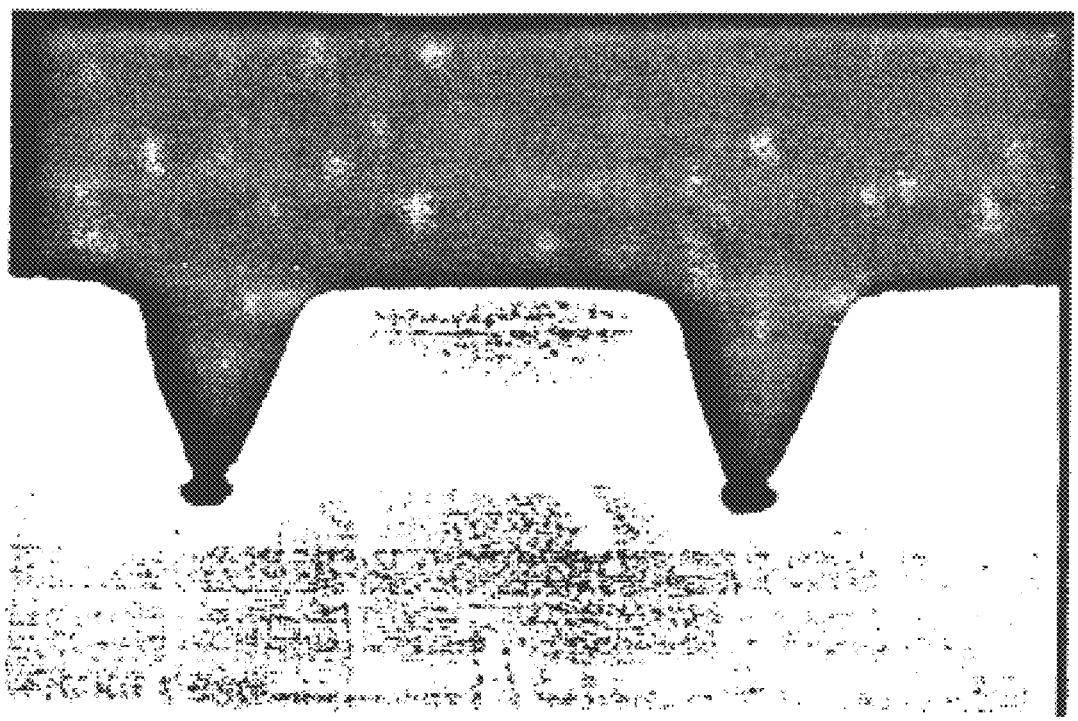
FIG. 21 is a picture showing an elevational view of the test semiconductor wafer of FIG. 20 after the oxide mask was removed.
Figure 22:
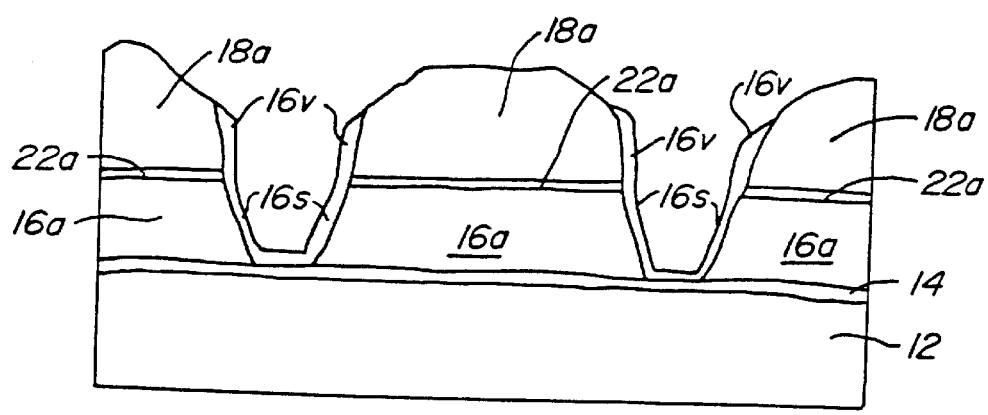
FIG. 22 is a drawing representing the elevational view in the picture of FIG. 19 with the respective parts identified by a reference numeral.
Figure 23:
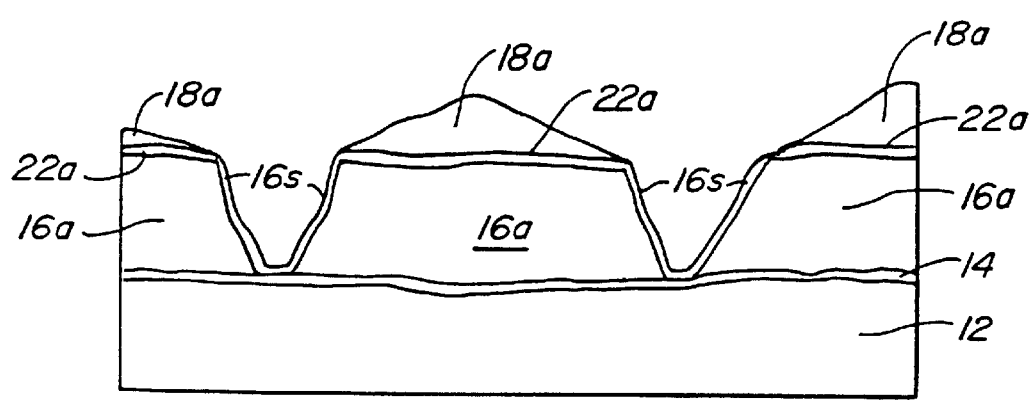
FIG. 23 is a drawing representing the elevational view in the picture of FIG. 20 with the respective parts identified by a reference numeral.
Figure 24:
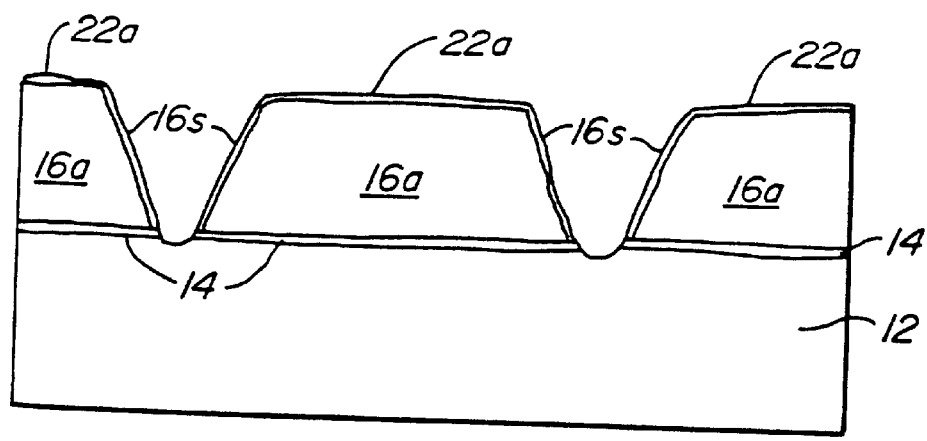
FIG. 24 is a drawing representing the elevational view in the picture of FIG. 21 with the respective parts identified by a reference numeral.

The oxide hard mask was then removed in a 6:1 HF solution to produce the veil-less test semiconductor wafer shown in FIG. 21. The remaining TiN protective layer could be removed by any suitable means and/or in any suitable manner, such as by etching with Ar and Cl$_2$ as the etchant gases and in a DPS™ brand chamber of the Metal Etch DPS Centura™ brand plasma processing apparatus under the following reactor and process conditions:

| Reactor Conditions | |
|---|---|
| Pressure | 7 mTorr |
| RF Power to Coil Inductor | 900 watts |
| RF Power to Wafer Pedestal | 100 watts |
| Temperature of Test Wafer | 110° C. |
| TiN Etch Rate | 2000 Å/min |
| Process Conditions Based on the Flow Rate of Ar and Cl$_2$ | |
| Ar | 25 sccm |
| Cl$_2$ | 50 sccm |
| Pressure | 7 mTorr |
| RF Power to Coil Inductor | 900 watts |
| RF Power to Wafer Pedestal | 100 watts |
| Temperature of Test Wafer | 110° C. |
| TiN Etch Rate | 2000 Å/min |

CONCLUSION

Thus, by the practice of the present invention there is provided a method for removing the redeposited veils 16v from the etched platinum electrode layer 16a formed during etching of the platinum electrode layer 16. The redeposited veils 16v are removed by overetching the etched platinum electrode layer 16a with a high density plasma and in accordance with the reactor and process conditions as previously stated. By removing the redeposited veils 16v with the overetching method of the present invention, the platinum profile is maintained and there is no damage to the etched platinum electrode layer 16a which could happen by conventional mechanical or wet-chemical removal methods.

Thus, while the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope of the invention as set forth.

What is claimed is:

1. A method of plasma-etching a workpiece having a multi-layer structure thereon including a substrate, a platinum layer, an insulative layer over the platinum layer, and a patterned resist layer over the insulative layer, the method comprising:

subjecting the workpiece to a plasma comprising a first etching processing gas environment to remove portions of the insulative layer unprotected by the patterned resist to expose portions of the platinum layer beneath the insulative layer;

subjecting the workpiece to a plasma substantially comprising argon to remove portions of the platinum layer exposed by the removal of portions of the insulative layer; and subjecting the workpiece to a high density plasma substantially comprising a gas selected from the group consisting of oxygen, chlorine, and mixtures thereof to remove deposited veils.

2. A method as in claim 1 in which the high density plasma to remove deposited veils is maintained at an ion density greater than about $10^9/cm^3$.

3. A method as in claim 2 in which the high density plasma to remove deposited veils is maintained using an inductively coupled plasma source.

4. A method as in claim 2 in which the high density plasma to remove deposited veils is maintained using one or more of a helicon resonance and an electron cyclotron resonance source.

5. A method as in claim 1 in which the high density plasma to remove deposited veils is maintained at an ion density greater than about $10^{11}/cm^3$.

6. A method as in claim 1 in which the plasma substantially comprising argon removes the exposed platinum layer at an etch rate exceeding 1000 Angstroms per minute.

7. A method as in claim 1 in which the resist layer is removed from the insulative layer by subjecting the workpiece to an oxygen-bearing reactive gas environment.

8. A method as in claim 1 in which the first etching processing gas environment comprises a flourine-bearing gas, and the insulative layer comprises silicon oxide or silicon nitride.

9. A method as in claim 1 in which a protective layer is provided between the platinum layer and the insulative layer.

10. A method as in claim 9 in which the protective layer comprises one or more of titanium or titanium nitride, and a second etching processing gas environment is provided to remove said protective layer and said second etching processing gas environment is selected from the group consisting of $Cl_2$, $BCl_3$, Ar, and mixtures thereof.

11. A method as in claim 1 wherein said high density plasma comprises from about 50% by volume to about 100% by volume oxygen and from about 0% by volume to about 50% by volume chlorine.

12. A method as in claim 1 wherein said high density plasma comprises from about 75% by volume to about 85% by volume oxygen and from about 15% by volume to about 25% by volume chlorine.

13. A method for removing veils from a platinum electrode formed during etching of the platinum electrode comprising:

providing a platinum electrode having veils formed on the platinum electrode during etching of the platinum electrode; and etching said platinum electrode in a high density plasma of an etchant gas to remove said veils from said platinum electrode.

14. A method of claim 13 wherein said etchant gas of said high density plasma comprises oxygen.

15. A method of claim 13 wherein said etchant gas of said high density plasma is selected from the group consisting of chlorine, oxygen, argon and mixtures thereof.

16. The method of claim 13 wherein said etchant gas of said high density plasma consists of oxygen ad chlorine.

17. The method of claim 13 wherein said platinum electrode additionally comprises a mask layer disposed on a selected part of said platinum electrode to selectively protect said platinum electrode during said etching of said platinum electrode.

18. The method of claim 17 wherein said platinum electrode additionally comprises a protective layer disposed on said selected part of said platinum electrode between said mask layer and said platinum electrode.

19. The method of claim 18 additionally comprising removing said mask layer during said etching of said platinum electrode.

20. The method of claim 19 additionally comprising removing said protective layer after removing said mask layer.

21. The method of claim 13 wherein said veils having been formed on said platinum electrode by etching of said platinum electrode in a plasma of an etchant gas comprising argon.

22. The method of claim 13 wherein said high density plasma comprises from about 50% by volume to about 100% by volume oxygen and from about 0% by volume to about 50% by volume chlorine.

23. The method of claim 13 wherein said high density plasma comprises from about 75% by volume to about 85% by volume oxygen and from about 15% by volume to about 25% by volume chlorine.

24. A method for producing a capacitance structure including a platinum electrode comprising:

providing a substrate supporting a platinum electrode layer and at least one mask layer disposed on a selected part of said platinum electrode layer;

etching said platinum electrode layer including employing a plasma of an etchant gas to produce said substrate supporting an etched platinum electrode layer with said at least one mask layer disposed on a selected part of said etched platinum electrode layer; and overetching said etched platinum electrode layer including employing a high density plasma of an etchant gas to produce a capacitance structure.

25. The method of claim 24 wherein said etched platinum electrode layer produced by said etching includes at least one veil formed thereon; and said overetching removes said at least one veil from said etched platinum electrode layer.

26. The method of claim 24 wherein said etched platinum electrode layer produced by said etching includes at least two veils formed thereon with said mask layer disposed on said selected part of said etched platinum electrode layer between said two veils; and said overetching removes said two redeposited veils from said etched platinum electrode layer.

27. The method of claim 26 additionally comprising removing said at least one mask layer after said overetching of said platinum electrode layer.

28. The method of claim 26 additionally comprising removing said at least one mask layer during said overetching of said platinum electrode layer.

29. The method of claim 24 wherein said etchant gas of said high density plasma comprises oxygen.

30. The method of claim 24 wherein said etchant gas of said high density plasma is selected from the group consisting of chlorine, oxygen and mixtures thereof.

31. The method of claim 24 wherein said etchant gas of said high density plasma consists of oxygen and chlorine.

32. The method of claim 24 wherein said high density plasma comprises from about 50% by volume to about 100% by volume oxygen and from about 0% by volume to about 50% by volume chlorine.

33. The method of claim 32 wherein said etching of said platinum electrode layer includes employing said plasma of said etchant gas comprising argon.

34. The method of claim 24 wherein said high density plasma comprises from about 75% by volume to about 85% by volume oxygen and from about 15% by volume to about 25% by volume chlorine.

35. The method of claim 24 wherein said etching of said platinum electrode layer includes employing said plasma of said etchant gas comprising argon.

36. A method of manufacturing a semiconductor device comprising:
forming a resist layer, an insulation layer and a platinum electrode layer on a substrate having circuit elements formed thereon;
etching a portion of said insulation layer including employing a plasma of an etchant gas to break through and to remove said portion of said insulation layer from said platinum electrode layer to produce said substrate supporting said resist layer, a residual insulation layer, and said platinum electrode layer;
removing said resist layer to produce said substrate supporting said residual insulation layer and said platinum electrode layer;
etching said platinum electrode layer including employing a plasma of an etchant gas to produce said substrate supporting said residual insulation layer disposed on an etched platinum electrode layer having at least one veil formed thereon; and
overetching said etched platinum electrode layer including employing a high density plasma of an etchant gas to remove said veil from said etched platinum electrode layer and produce a semiconductor device.

37. The method of claim 36 additionally comprising removing said residual insulation layer after said overetching of said etched platinum electrode layer.

38. The method of claim 36 additionally comprising removing said residual insulation layer after said overetching of said etched platinum electrode layer.

39. The method of claim 36 wherein said forming additionally comprises disposing a protective layer on said platinum electrode layer between said insulation layer and said platinum electrode layer.

40. The method of claim 36 wherein said etched platinum electrode layer produced by said etching of said platinum electrode layer includes a pair of veils opposedly formed thereon with said residual insulation layer disposed on said etched platinum electrode layer between said pair of veils; and said overetching of said etched platinum electrde layer removes said pair of veils from said etched platinum electrode layer.

41. The method of claim 36 wherein said etchant gas of said high density plasma consists of oxygen.

42. The method of claim 36 wherein said etchant gas of said high density plasma comprises chlorine.

43. The method of claim 36 wherein said etchant gas of said high density plasma consists of oxygen and chlorine.

44. The method of claim 36 wherein said high density plasma comprises from about 50% by volume to about 100% by volume oxygen and from about 0% by volume to about 50% by volume chlorine.

45. The method of claim 44 wherein said etching of said platinum electrode layer includes employing said plasma of said etchant gas comprising argon.

46. The method of claim 36 wherein said high density plasma comprises from about 75% by volume to about 85% by volume oxygen and from about 15% by volume to about 25% by volume chlorine.

47. The method of claim 36 wherein said etching of said platinum electrode layer includes employing said plasma of said etchant gas comprising argon.

48. A method for removing redeposited platinum-containing etch material comprising:
providing a multilayered structure including a platinum layer, an etched mask layer disposed on said platinum layer, and redeposited platinum-containing etch material; and,
contacting at least a portion of said redeposited platinum-containing etch material with a high density plasma of an etchant gas, to remove redeposited platinum-containing etch material.

49. The method of claim 48 wherein said etched mask layer comprises at least one etched sidewall which is in contact with said redeposited platinum-containing etch material.

50. The method of claim 49 additionally comprising etching said platinum layer to produce an etched platinum structure having at least one platinum sidewall supporting a redeposited platinum-containing material, prior to removing said redeposited platinum-containing etch material.

51. The method of claim 50 wherein said redeposited platinum-containing material on said sidewall of said etched mask layer and said redeposited platinum-containing material on said platinum sidewall of said platinum layer comprises at least one veil.

52. The method of claim 51 additionally comprising removing a portion of the etched mask layer during said removing of said redeposited platinum-containing material.

53. The method of claim 51 additionally comprising etching said veil in a high density plasma of an etchant gas to remove said veil.

54. The method of claim 53 wherein said etching of said veil includes etching said veil when said wafer has a temperature ranging from 20° C. to 500° C.

55. The method of claim 53 wherein said etching of said veil includes etching said veil when said wafer has a temperature ranging from 100° C. to 300° C.

56. The method of claim 51 wherein said etchant gas of said high density plasma comprises oxygen.

57. The method of claim 51 wherein said etchant gas of said high density plasma is selected from the group consisting of chorine, oxygen, argon, and mixtures thereof.

58. The method of claim 51 wherein said high density plasma comprises from about 50% by volume to about 100% by volume oxygen and from about 0% by volume to about 50% by volume chlorine.

59. The method of claim 51 wherein said etchant gas of said high density plasma comprises chlorine.

60. The method of claim 49 wherein said redeposited platinum-containing material on said mask sidewall comprises a veil.

61. The method of claim 49 additionally comprising removing a portion of the etched mask layer during said removing of said redeposited platinum-containing material.

62. The method of claim 48 additionally comprising etching said platinum layer to produce an etched platinum structure having at least one platinum sidewall supporting a redeposited platinum-containing material, prior to removing said redeposited platinum-containing etch material.

63. The method of claim 62 additionally comprising removing a portion of the etched mask layer during said removing of said redeposited platinum-containing material.

64. The method of claim 62 wherein said removing of said redeposited platinum-containing material includes etching said redeposited platinum-containing material when said wafer has a temperature ranging from 20° C. to 500° C.

65. The method of claim 62 wherein said removing of said redeposited platinum-containing material includes etching said redeposited platinum-containing material when said wafer has a temperature ranging from 100° C. to 300° C.

66. The method of claim 62 wherein said etchant gas of said high density plasma comprises oxygen.

67. The method of claim 62 wherein said etchant gas of said high density plasma is selected from the group consisting of chlorine, oxygen, argon, and mixtures thereof.

68. The method of claim 62 wherein said high density plasma comprises from about 50% by volume to about 100% by volume oxygen and from about 0% by volume to about 50% by volume chlorine.

69. The method of claim 62 wherein said etchant gas of said high density plasma comprises chlorine.

70. The method of claim 48 wherein said removing of said redeposited platinum-containing material includes etching said redeposited platinum-containing material.

71. The method of claim 48 wherein said removing of said redeposited platinum-containing material includes etching said redeposited platinum-containing material when said wafer has a temperature ranging from 20° C. to 500° C.

72. The method of claim 71 wherein said etchant gas of said high density plasma comprises oxygen.

73. The method of claim 71 wherein said etchant gas of said high density plasma is selected from the group consisting of chlorine, oxygen, argon, and mixtures thereof.

74. The method of claim 71 wherein said high density plasma comprises from about 50% by volume to about 100% by volume oxygen and from about 0% by volume to about 50% by volume chlorine.

75. The method of claim 71 wherein said etchant gas of said high density plasma comprises chlorine.

76. The method of claim 48 wherein said removing of said redeposited platinum-containing material including etching said redeposited platinum-containing material when said wafer has a temperature ranging from 100° C. to 300° C.

77. The method of claim 48 wherein said etchant gas of said high density plasma comprises oxygen.

78. The method of claim 48 wherein said etchant gas of said high density plasma is selected from the group consisting of chlorine, oxygen, argon, and mixtures thereof.

79. The method of claim 48 wherein said etchant gas of said high density plasma consists of oxygen and chlorine.

80. The method of claim 48 wherein said etchant gas of said high density plasma consists of oxygen.

81. The method of claim 48 wherein said high density plasma comprises from about 50% by volume to about 100% by volume oxygen and from about 0% by volume to about 50% by volume chlorine.

82. The method of claim 48 wherein said high density plasma comprises from about 75% by volume to about 85% by volume oxygen and from about 15% by volume to about 25% by volume chlorine.

83. The method of claim 48 wherein said etchant gas of said high density plasma comprises chlorine.

* * * * *